US005130710A

United States Patent [19]

Salazar

[11] Patent Number: 5,130,710

[45] Date of Patent: Jul. 14, 1992

[54] MICROCOMPUTER-CONTROLLED ELECTRONIC POSTAGE METER HAVING PRINT WHEELS SET BY SEPARATE D.C. MOTORS

[75] Inventor: Edilberto I. Salazar, Brookfield, Conn.

[73] Assignee: Pitney Bowes Inc., Stamford, Conn.

[21] Appl. No.: 727,037

[22] Filed: Jul. 8, 1991

Related U.S. Application Data

[62] Division of Ser. No. 423,822, Oct. 18, 1989.

[51] Int. Cl.[5] ........ H03M 1/22

[52] U.S. Cl. ........ 341/11; 341/13

[58] Field of Search ........ 341/13, 11, 1; 250/231 SE

[56] References Cited

U.S. PATENT DOCUMENTS

| | | | |
|---|---|---|---|
| 3,142,835 | 7/1964 | Larky | 341/13 |
| 3,242,478 | 3/1966 | Kaestner | 341/13 X |
| 3,418,653 | 12/1968 | Robinson | 341/13 X |
| 3,717,869 | 2/1973 | Batz | 341/11 |
| 3,913,095 | 10/1975 | Dlugos | 341/13 |
| 4,500,780 | 2/1985 | Buan et al. | 250/231 SE |
| 4,524,347 | 6/1985 | Rogers | 341/13 X |
| 4,746,792 | 5/1988 | Dil | 341/13 X |
| 4,757,196 | 7/1988 | Yamada et al. | 250/231 SE |
| 4,975,569 | 12/1990 | Ebina et al. | 341/13 X |
| 5,021,781 | 6/1991 | Salazar et al. | 341/13 |

*Primary Examiner*—Sharon D. Logan

*Attorney, Agent, or Firm*—Charles G. Parks, Jr.; David E. Pitchenik; Melvin J. Scolnick

[57] ABSTRACT

An electronic postage meter is disclosed which includes a plurality of print devices each individually settable to a desired position so that the print devices may print a desired postage value; a plurality of d.c. motors, one for each of the plurality of the print devices, a different one of the d.c. motors being coupled to a different one of the print devices for setting the respective print device to a respective desired position; actual position sensing means for providing signals related to the actual positions of the print devices; and a microcomputer coupled to the d.c. motors and to the actual position sensing means. The microcomputer in response to signals from the actual position sensing means, a desired postage value and programming of the microcomputer sequentially controls the d.c. motors to set the print devices to respective desired positions for printing the desired postage value. The microcomputer includes a single microprocessor which performs all electronic control functions of the postage meter including time-intensive closed loop control of the d.c. motors, printing control and accounting. The control loops include low cost, low bandwidth incremental quadrature encoders.

6 Claims, 17 Drawing Sheets

| SYMBOL | PARAMETER | MIN | MAX |
|---|---|---|---|
| $\theta_C$ | ENCODER QUADRATURE CYCLE PER DIGIT, IN ELECTRICAL DEGREES | 349.2° | 370.8° |
| $\theta_1, \theta_2, \theta_3, \theta_4$ | ENCODER STATE SWITCHING POINT, IN ELECTRICAL DEGREES | 87.3 | 92.7 |
| $t_S$ | ENCODER STATE TRANSITION TIME | 60ms | |
| $S_{FD}$ | FULL-DIGIT ENCODER STATE | D0 = 0 D1 = 0 | |

FULL-DIGIT QUADRATURE STATE = 00

1 ENCODER TRANSITION = 1/4 MOTOR REV

MAXIMUM OFFSET DISTANCE = 1/2 MOTOR REV

MAXIMUM ENCODER TRANSITION = 3 COUNT PER OFFSET DISTANCE

1 MOTOR REV

FIG. 14

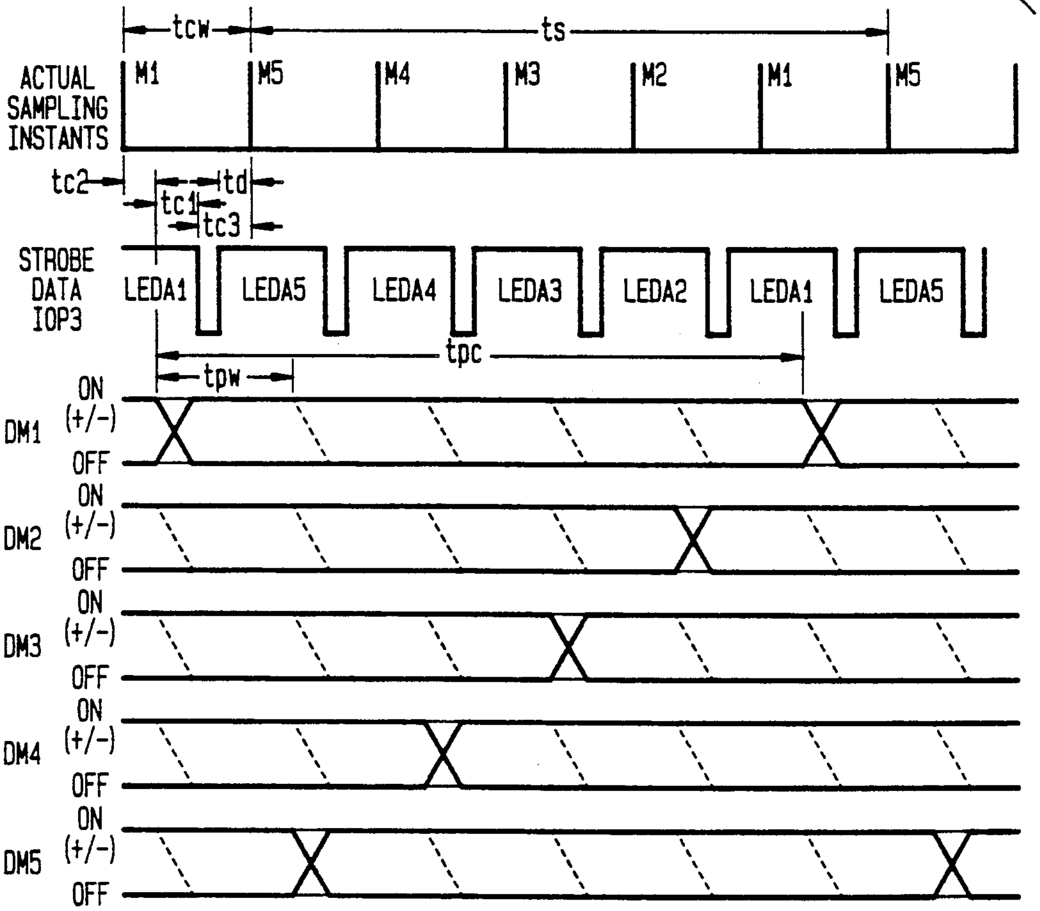

| SYMBOL | PARAMETER | MIN | MAX |
|---|---|---|---|
| ts | SAMPLING (CONTROL) PERIOD, T | | 2.5 ms |
| tcw | CONTROL EXECUTION TIME PER MOTOR | | 500.0 $\mu$s |
| tc1 | TIME TO SAMPLE, COMPUTE CONTROL OUTPUT g (Tn) | | 200.0 $\mu$s |
| tc2 | TIME TO UPDATE ALL 5 PWM DRIVE OUTPUTS | | 150.0 $\mu$s |
| tc3 | TIME TO COMPUTE CONTROL TERM, X (Tn), DESIRED POSITION, Pd (Tn+1), AND PARALLEL MOTION SUPERVISION | | 150.0 $\mu$s |
| td | NEXT CONTROL STROBE-ON-TO-NEXT CONTROL SAMPLING INSTANT TIME DELAY | 20.0 $\mu$s | |
| tpw | PWM DRIVE PULSE-WIDTH RESOLUTION | | 500.0 $\mu$s |
| tpc | PWM DRIVE TIME PERIOD | | 2.5 ms |

WHERE:

Wo = 80 REV/SEC d = 36.57 ENCODER TRANSITIONS/SAMPLING INTERVAL, $T^2$

Sd = 1/8 X St MOTOR REV

Tm = 31.0ms (CALCULATED)

$$Td = \sqrt{\frac{2Sd}{d}}$$ UNITS OF T

MICROCOMPUTER-CONTROLLED ELECTRONIC POSTAGE METER HAVING PRINT WHEELS SET BY SEPARATE D.C. MOTORS

This application is a divisional of U.S. Ser. No. 07/423,822 filed on Oct. 18, 1989 now U.S. Pat. No. 5,121,327.

RELATED APPLICATIONS

The following applications, all assigned to the assignee of this application, are related to this application: Ser. No. 423,813, filed Oct. 18, 1989, titled MICROCOMPUTER-IMPLEMENTED CONTROL OF SEPARATE D.C. MOTORS FOR SETTING A PLURALITY OF POSTAGE METER PRINT WHEELS; application Ser. No. 423,330, filed Oct. 18, 1989, titled TWO STAGE QUADRATURE INCREMENTAL ENCODER; and Ser. No. 423,812, filed Oct. 18, 1989, titled FRAUD DETECTION IN POSTAGE METER HAVING UNSECURED PRINT WHEELS. The disclosures of those three applications are incorporated herein by reference.

BACKGROUND OF THE INVENTION

The invention disclosed herein relates to a system for controlling a plurality of positioning devices such as d.c. motors in apparatus such as an electronic postage meter, and to controlling other functions of the apparatus. More particularly, the invention relates to an electronic postage meter including a plurality of value settable print wheels, and a microcomputer for controlling multiple d.c. motors to set the print wheels and for controlling other postage meter functions. The invention also relates to an incremental position encoder for supplying information related to the actual positions of devices such as print wheels which are to be positioned. The invention has particular application to devices such as electronic postage meters requiring low cost, compact apparatus for controlling positioning of a plurality of devices such as postage value digit devices, e.g., print wheels.

Relatively accurate positioning of devices such as a print wheel in an electronic postage meter may be obtained using a stepper motor or a d.c. motor. An advantage of a stepper motor over a d.c. motor is that the stepper motor has defined stable equilibrium or detent positions, i.e., discrete positions in a fixed increment or step angle, which allows the stepper motor to be driven in open loop mode. As a result, control of a stepper motor as compared to a d.c. motor is relatively simple and does not require a motion transducer, such as an encoder, and a control loop, although it may be desirable to verify the detent positions of the motor. However, under high inertial loads and opposing load torques, for example, friction, a stepper motor may be unstable and lose step synchronism. To avoid such instability, the size (torque) of the stepper motor is increased in comparison to load requirements to provide sufficient margins at the desired speeds. Thus, a disadvantage of a stepper motor in positioning apparatus in comparison to a d.c. motor is the relatively large size-to-torque ratio needed to ensure stable operation.

An advantage of a d.c. motor in positioning apparatus in comparison to a stepper motor is that the d.c. motor may be smaller for the same load requirements and yet operate at higher speed than a larger size stepper motor. Additionally, the smaller d.c. motor allows a higher load-to-motor coupling (gear) ratio than a larger size stepper motor for the same load. Thus, the d.c. motor increases the torque available to the load at the desired speed as compared to a stepper motor which at the same torque and coupling ratio will operate at lower speed. Other advantages of a d.c. motor over a stepper motor are the reduced power dissipation (and corresponding reduced heat generation) and reduced power supply requirement for d.c. and stepper motors of comparable size-to-torque ratio. A d.c. motor has a single phase winding with a high back electromotive force, and requires a single output stage driver for the single phase winding. A comparable stepper motor has a two phase winding with the same winding resistance of the single phase d.c. motor winding. Hence, the stepper motor winding requires twice the power supply requirement as the comparable d.c. motor. Also, the stepper motor requires an output stage driver for each winding. Hence, the stepper motor requires twice the number of output stage drivers as the d.c. motor.

A disadvantage of a d.c. motor over a stepper motor is that the d.c. motor requires a control loop, which adds to the cost and complexity of the positioning apparatus.

If multiple loads are to be controlled by separate motors, the disadvantages of stepper motors and d.c. motors for position control implemented as described above are multiplied.

The disclosure of the following U.S. patents are incorporated herein by reference: U.S. Pat. Nos. 4,630,210, 4,631,681, 4,636,959, 4,646,635, 4,665,353, 4,638,732 and 4,774,446 all of Salazar et al., and 4,635,205 of Eckert, et al. All of those patents are assigned to the assignee of this application. Those patents disclose an electronic postage meter including a computer-controlled d.c. motor used to control a plurality of mechanical loads, for example print wheels. A stepper motor and gearing selectively couple the same d.c. motor to a plurality of loads. The time-intensive control function for the d.c. motor is implemented by the computer and software, except for the amplifier driving the d.c. motor and an actual position encoder and counting circuitry which feeds back actual positional information. The computer and the software calculate and apply to the d.c. motor, via the amplifier, pulse width modulated (PWM) drive signals utilizing a digital compensator derived from an analysis of the d.c. motor, the motor load, and other control loop components. The d.c. motor is driven according to a predetermined velocity versus time profile stored in the computer. The encoder and counting circuitry provide digital signals to the computer and the computer provides digital PWM drive signals so that analog-to-digital and digital-to-analog converter devices are not required in the controller electronics.

In the above patents, the computer is dedicated to motor control and separate microprocessors are provided to carry out other postage meter system functions such as keyboard and display control, accounting and printing.

In the patents referenced above, the actual position encoder is an incremental encoder which provides in response to motor shaft rotation two electrical signals 90 electrical degrees out of phase, i.e., in quadrature. The two signals together provide N quadrature states per motor shaft rotation. Shaft position is determined by counting the quadrature states and rotation direction is determined from the phase of the two signals, i.e., which signal leads (or lags) the other. In the patents referenced above, the incremental encoder is implemented by a transparent disk having a plurality of opaque lines formed at equidistantly angularly-spaced intervals along one of the disc's opposed major surfaces, and an optical sensing device for serially detecting the presence of the respective opaque lines as they successively pass reference positions. In response to detecting the presence of the opaque lines, the encoder provides two output signals on two separate lines or channels in quadrature.

The two channel, quadrature output of the incremental encoder is decoded by counting circuitry. If desired, the quadrature signals may be decoded by the computer. Whether an external circuit or the computer decodes the quadrature output signals of the encoder depends upon whether the computer's internal counting circuit is available or is being used for other purposes. External decoding circuits are currently available as monolithic integrated circuits, for example, DHC 2000 from Texas instruments Incorporated.

To achieve high positional accuracy, position controllers of the type described above utilize a high resolution encoder and sample at 1 ms or less intervals, which means that the controllers have a relatively high motor control bandwidth requirement of 1 KHz or greater. High bandwidth controllers utilizing high resolution encoders are relatively expensive.

Because of the high bandwidth requirement, a processor in such controllers is typically dedicated to motor control. Therefore, larger systems which include a d.c. motor and loop control therefor require other processors for control of other system functions, which increases the size and cost of the larger system.

U.S. Pat. Nos. 4,710,883 of Wilson et al., 4,710,882 of DiGiulio et al., and 4,701,856 of DiGiulio et al., all assigned to the assignee of this application, disclose an electronic postage meter comprising a microcomputer for controlling postage meter functions including postage value setting, postage printing and postage accounting. The disclosures of the '883, '882 and '856 Patents are incorporated herein by reference. As disclosed in these patents, a single central processing unit (CPU) performs calculations and data flow within the postage meter and controls postage setting and printing. The '883 Patent discloses that the electronic postage meter therein includes a timer, preferably external to the microcomputer, for providing a periodic interrupt in response to which the microcomputer interrupts a routine being executed and proceeds to examine sensors, inputs and outputs for machine status changes. A queue of individual tasks which comprise the operation of the postage meter are scheduled as required in accordance with machine status. A task switcher proceeds to service tasks in a "round-robin" fashion. Tasks that are inactive or waiting for an event are ignored. The first task encountered that needs to be serviced is granted control of the CPU. When all tasks have been polled, the polling cycle begins again. The tasks quickly perform a function and then relinquish the CPU to wait for an event to occur. This permits the next task in the round-robin to gain the services of the CPU. A task may run to completion or suspend itself and permit task switching. A timer is set to zero each time that a task is activated, and then decremented in 2.5 ms intervals during CPU servicing of that task. Task priorities are assigned.

The '883, '882 and '856 Patents do not provide specific details of the postage setting and printing apparatus.

U.S. Pat. No. 4,731,728 of Muller, also assigned to the assignee of this application, discloses a postage meter having separate microprocessors for controlling postage value selection, accounting and keyboard and display functions. This patent also discloses shutter and interposer apparatus, and an accounting algorithm for controlling printing and postage accounting. The disclosure of the '728 Patent is incorporated herein by reference.

There is thus a need for a low cost, compact system, both mechanically and electrically, for accurately positioning a plurality of devices such as print wheels in an electronic postage meter, and which, when forming part of a larger system such as a postage meter, carries out other system functions, for example, postage meter keyboard and/or display control, and/or accounting and/or printing functions. There is also a need for a low cost, low bandwidth position encoder for use in a close loop position control system, particularly a low bandwidth system.

SUMMARY OF THE INVENTION

It is an object of the invention disclosed herein to provide an improved electronically-controlled postage meter.

It is another object of the invention to provide an electronic postage meter having a low cost, compact electronic section.

It is another object of the invention to provide an electronic postage meter that sets the value digits of the postage print device in parallel.

It is another object of the invention to provide an electronic postage meter having a central processing unit, preferably a single chip microprocessor integrated circuit, which controls all electronically-controlled postage meter functions including setting of the postage value digits and postage printing and accounting.

It is another object of the invention to provide an improved electronic control for a plurality of d.c. motors, particularly one which is inexpensive and has a low bandwidth, particularly for use in an electronic postage meter to set the postage value digits of the postage print device.

It is another object of the invention to provide a low cost incremental encoder for a close loop positional control system.

It is another object of the invention to provide such an encoder which may be utilized in a low bandwidth positional control system.

It is another object of the invention to provide an improved electronic control for a plurality of d.c. motors.

Individual and combinations of the above and other objects are achieved by providing a plurality of d.c. motors to position devices such as postage meter print devices in parallel, and servo control loops for the motors which include common drive signal means. When forming part of a larger system such as an electronic postage meter, a programmed processing means constitutes the common drive signal means and performs other system functions. The servo loop comprises means for sensing the actual positions (absolute or relative) of the devices and providing the actual position information for each of the devices, preferably in digital form, to the common drive signal means.

In a specific embodiment, the common drive signal means receives desired and actual position information for the motors and in response thereto provides drive signals to the motors to drive them to the desired positions. The common drive signal means includes means which receive digital signals representing the desired and actual position information for respective d.c. motors and generates for respective d.c. motors respective pulse width modulation (PWM) digital drive signals.

The common drive signal means receives the desired position information and the actual position information for respective motors, and operates on the desired position information and the actual position information for one of the d.c. motors at a time for generating the drive signals for respective motors. Thus, a control loop is provided for each of the d.c. motors, and each of the control loops shares a common means which generates motor drive signals from desired position information and actual position information for one of the d.c. motors at a time.

In a specific embodiment, the common drive signal means includes means for generating a motion profile for movement of the d.c. motors in response to desired position information, and pulse width modulation means for generating the PWM drive signals. The PWM means comprises a digital compensation filter coupled to the motion profile generating means which receives actual and desired position information and generates digital compensation signals. The PWM means includes means converting the compensation signals into PWM motor drive signals. Amplifiers may be provided to amplify the PWM signals depending on motor drive requirements, etc.

According to the invention, a computer constitutes the common drive signal means. The computer has a plurality of outputs for outputting PWM drive signals, one for each of the d.c. motors. Preferably, the computer is a microcomputer which preferably comprises a single central processing unit, preferably implemented by a single chip integrated circuit microprocessor. Preferably, the controlled devices are identical, e.g., postage meter print wheels, and the d.c. motors are identical.

According to the invention, an electronic postage meter is provided which includes a plurality of postage value digit devices, e.g., print wheels, which are set by the postage meter for printing postage on a mail piece. In accordance with the invention, the value digit devices are set in parallel, and the apparatus for setting the value digits is mechanically and electrically compact and of low cost. According to the invention, the postage meter is provided with a plurality of d.c. motors and servo loops including a common drive signal means as described above for setting the digit values in parallel. Further in accordance with the invention, the actual position sensing means comprises a low cost, low bandwidth incremental encoder as described herein. The d.c. motors may be brush or brushless. However, brushless are preferred for their high torque-to-frame ratio since compactness is an important consideration of the invention.

According to an embodiment of the invention incorporated into an electronic postage meter, a computer controls the motors and preferably is a microcomputer which includes a single central processing unit preferably, a single chip microprocessor integrated circuit. The microcomputer controls other, preferably all, electronically-controlled postage meter functions including accounting, printing information entry and display, fault monitoring, etc.

In a specific embodiment of the invention, an electronic postage meter comprises a plurality of print devices each individually settable to a desired position so that the print devices may print a desired postage value; a plurality of d.c. motors, one for each of the plurality of the print devices, a different one of the d.c. motors being coupled to a different one of the print devices for setting the respective print device to a respective desired position essentially in parallel; actual position sensing means for providing signals related to the actual positions of the print devices; a microcomputer coupled to the d.c. motors and to the actual position sensing means, the microcomputer in response to signals from the actual position sensing means, a desired postage value and programming of the microcomputer sequentially (but effectively in parallel) controlling the d.c. motors to set the print devices to respective desired positions for printing the desired postage value. The microcomputer also monitors and controls at least one, preferably a plurality of, and most preferably all other postage meter functions.

The microcomputer comprises common means receiving the signals related to the actual positions of the print devices and desired postage values and generating motor drive signals for one of the d.c. motors at a time corresponding to movement of respective print devices towards respective desired positions. The common means in the microcomputer includes the motion profile generating means and the PWM means described above.

In a preferred embodiment, the electronic postage meter comprises means for entering information into the postage meter including postage values, e.g., a keyboard; a means for displaying information such as postage values, e.g., a liquid crystal device (LCD); and non-volatile memory (NVM) for storing accounting and other information. The microcomputer is coupled to the entering means, the display means, the NVM, the d.c. motors, and the position sensing means and sequentially monitors and controls functions associated therewith including postage accounting.

A method according to the invention for controlling a postage meter including controlling the position of a plurality of print devices, comprises coupling a separate d.c. motor to each of the plurality of devices so as that a respective d.c. motor moves a respective device to a plurality of respective positions; providing a microcomputer having a single central processing unit to control the motors and other functions of the postage meter; providing information to the microcomputer corresponding to the actual position of each of the devices; providing information to the microcomputer corresponding to the desired position of each of the devices; programming the microcomputer to sequentially control the motors and other postage meter functions including: utilizing common means in the microcomputer and the actual position information and the desired position information to generate motor drive signals for one of the d.c. motors at a time corresponding to movement of respective devices towards respective desired positions; coupling the drive signals generated by the computer to the d.c. motors; and sequentially controlling at least one and preferably a plurality of other postage meter functions as described herein.

A method according to the invention for controlling the position of a plurality of devices, comprises: coupling a separate d.c. motor to each of the plurality of devices so that a respective d.c. motor moves a respective device to a plurality of respective positions; sensing the actual position of each of the devices; determining the desired position of each of the devices; utilizing a common means for generating motor drive signals in response to the actual position sensed and the desired position determined for one of the d.c. motors at a time; and supplying the drive signals to the d.c. motors.

The invention also provides a low cost, low bandwidth incremental position encoder which provides first and second output signals which contain information of the actual, incremental position of a device, e.g., a print wheel driven by a d.c. motor as described above. The first and second output signals are provided on first and second lines which constitute two channels (CH A and CH B) of the encoder. In a preferred embodiment, the first and second signals are substantially out of phase, but less than by 180°, e.g., 90° out of phase, i.e., they are in quadrature.

The encoder includes a movable element having first series and second series of variations. The variations of the first and second series extend along respective parallel lines in the direction of movement of the movable element and the variations of the first and second series are transversely spaced with respect to each other. The widths of the first and second variations are equal and offset by a substantial amount, but less than the full width of a variation. The variations of the first and second series are detectable as they pass a reference point and the encoder includes encoder signal means for detecting the variations and providing first and second signals related to detection of the variations of the first and second series, respectively.

In a specific embodiment, the variations are optically detectable and the encoder signal means comprises means for projecting light at variations in the first and second series of variations and for detecting light emanating from the variations of the first and second series of variations.

In the preferred embodiment, the movable element is a wheel and the first and second series of variations are radially spaced and extend circumferentially about respective circumferences of first and second circles. The circumferential widths of the variations of the first and second variations are equal and circumferentially offset by half the circumferential width of a variation. The encoder signal means provides the first and second signals out of phase by 90°.

In the preferred embodiment, the variations of the first and second series of variations comprise circumferentially-extending slotted openings in the wheel, the slotted openings being of equal circumferntial width, radially spaced from each other, equidistantly angularly arranged about the respective circumferences of first and second concentric circles, and offset by half the circumferential width of an opening from each other.

The light projecting means comprises means for projecting light through the slotted openings in the first and second series of openings, for detecting light projected through the openings of the first and second series of openings, and for providing the first and second signals 90° out of phase.

The above and other objects, aspects, features and advantages of the invention will be more readily perceived from the description of the preferred embodiments thereof taken in conjunction with the accompanying drawings and appended claims.

BRIEF DESCRIPTION OF THE DRAWINGS

The invention is illustrated by way of example and not limitation in the figures of the accompanying drawings in which like references denote the same or corresponding parts, and in which:

FIG. 14 is a timing diagram illustrating the servo control cycle implementation of the microcomputer of FIG. 13;

DESCRIPTION OF THE PREFERRED EMBODIMENTS

Summary of the Preferred Embodiments

Figure 1:
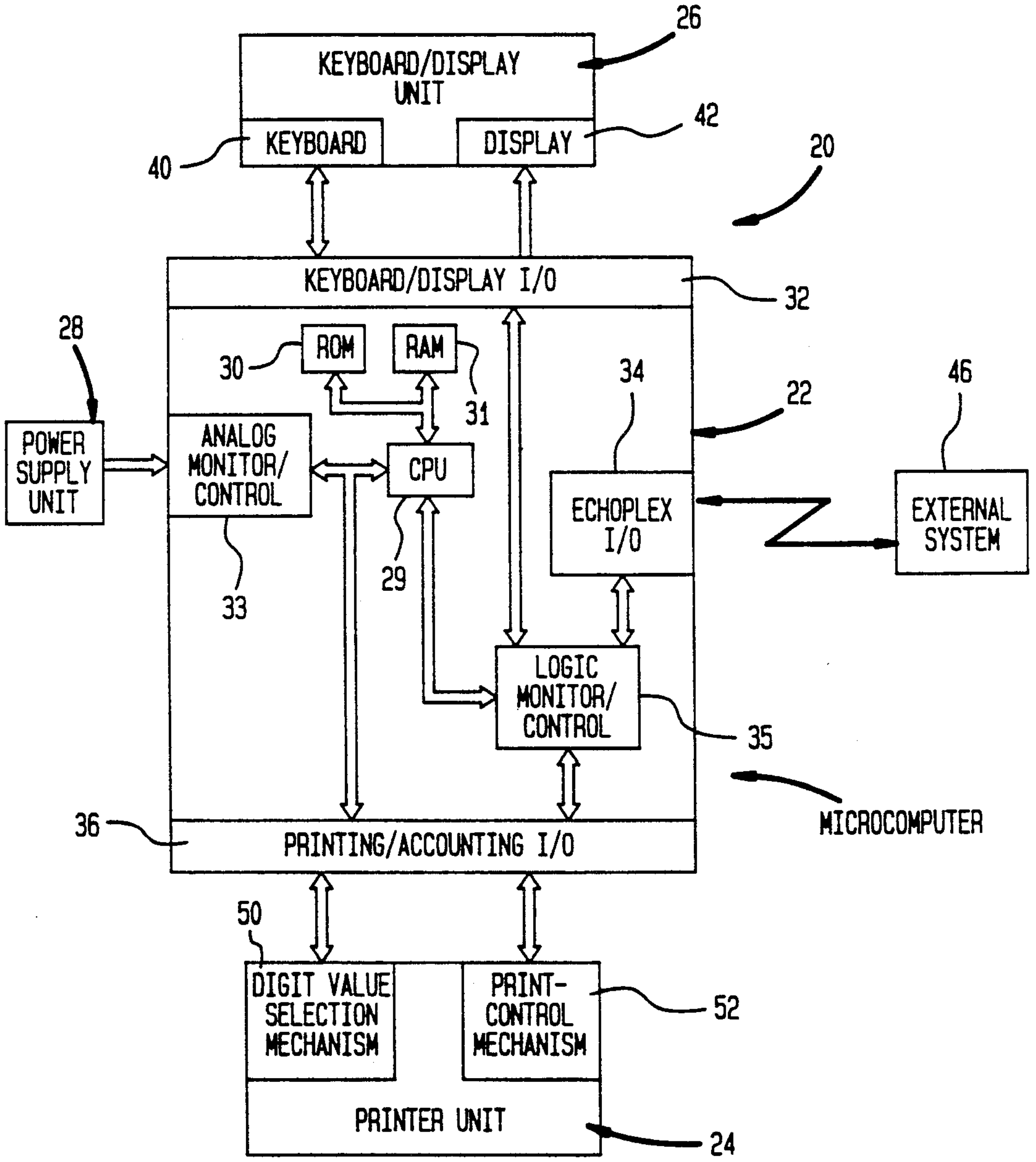
FIG. 1 is a block diagram of a postage meter incorporating the present invention.

In the preferred embodiment, an electronic postage meter is provided having five print wheels. The invention provides five separate closed-loop position controls realized in system controller electronics residing in a 5″×5″ printed wiring assembly. The invention incorporates minimum hardware implementation while supporting both multiple position loops control and system operating functions control, i.e., keyboard/display, accounting/printing, and external world communication.

The invention combines the multiple position loops control and the system operating functions control into a single microcomputer system. The motor control elements, except for the output stage amplifier drivers, are implemented by the microcomputer and its programming. In turn, the hardware system is designed in such a way to support the fastest and most efficient CPU execution of microcomputer implemented functions.

To simplify and reduce the cost of the position feedback hardware and its interface to the controller, each d.c. motor position loop is closed with a low cost, low bandwidth quadrature encoder to digitize the angular position of the motor drive shaft into four sensor states per code cycle (electrical). The number of encoder state transitions and its sequence are decoded by the microcomputer to obtain the incremental actual position counts and the direction of motion. The interface bandwidth between the controller and quadrature encoder is a function of the peak motor speed and the number of encoder state transitions per motor revolution.

To eliminate the need for an external analog to digital converter device per motor, the shaft encoder information is directly processed by the microcomputer. Hence, the quadrature and phase decoding, and state transition up/down counting (actual position count value) is accomplished by counting circuitry within the microcomputer, i.e., CPU, and not by an external device.

Each print wheel drive mechanism has a 10-to-1 gear ratio between the pinion gear of a rack and pinion drive and the motor shaft, i.e., 10 motor revolutions makes one pinion gear revolution. With this load transfer ratio, an accuracy of ¼ (quarter) motor revolution, i.e., ¼ of a full-digit (one motor, or, 1/10 pinion gear revolution, is equal to one-full-digit) is sufficient for the capture range of a mechanical aligner which positions racks in the print drum drive shaft that are coupled to the print wheels so that all the teeth on the respective racks are aligned with respect to each other. This ensures that the print wheels are all aligned at full digit positions in the printing area. Given this accuracy requirement, the encoder resolution is designed to give four state transitions per motor revolution. At a peak speed of about 4500 RPM, the encoder maximum frequency is approximately one state transition per three milliseconds. Hence, the maximum sampling period (bandwidth) was determined to be 2.5 ms. However, for motor speeds at which the maximum encoder output exceeds the controller bandwidth, tracking error will occur.

To provide the position control, the invention provides for implementation of a digital lead-lag filter routine by the CPU and programming separately for each motor. To handle five separate position loops, motor control is multiplexed within the 2.5 ms sampling period. Hence, each motor control processing takes 500 us which includes the decoding and counting of the shaft encoder signal, execution of the filter routine, generation of the PWM output drive signals, and calculation of the next period's desired position (in encoder counts). The output of the filter is transformed into PWM drive signals by PWM routine which generates, or, updates the PWM signal for the five controls every 500 us. Hence, this routine provides five discrete torque (current) values to each motor, i.e., 500 us increments with a 2.5 ms period. The next period's desired position is determined through a look-up table of discretized deceleration distance values with respect to the 2.5 ms interval (sampling period), that is, a controlled deceleration is invoked once ¾ of the total desired displacement is reached with 100% PWM duty-cycle.

Multiplexing of parallel motion control application and the system functions control was selected in recognition of the following system operational characteristics: (1) the system operating functions control requires a slower response time (about 4 times less) than the motor's position control requirement because of the former's mechanical actuation stimuli, i.e., keyboard, solenoid, and mechanical home positions sensors (except for the external system communication); (2) the printing/accounting is disabled before postage value setting commences and is enabled after setting; (3) the keyboard, display, and serial channel need not be serviced during postage value setting.

Given the above system characteristics, the invention provides that execution by the CPU of system function control is mutually-exclusive with motion control. In order not to lose track of the actual motor shaft positions (because of the relative encoding scheme), the quadrature decoding and routine counting is executed every sampling period of 2.5 ms, i.e., the up/down counter (shaft position count) is always updated for every encoder state transition. Therefore, the system software invokes motion control only if a postage setting is desired, or, a change in position of any motor is detected (steady-state error). With the latter, the position error can be corrected (i.e., servo) at any time the system function allows, as long as the system keeps track of the actual position count.

In a parallel-setting value selection mechanism in an electronic postage meter according to the invention, the digit print wheels of each bank must be moved separately to their desired settings (positions). Hence, in a five bank meter (1/1000 cent-bank to 10 dollar-bank), a prime mover is needed for each bank position. However, the selection of a prime mover and for the compact postage meter according to the invention and its associated control system can become difficult for the following reasons: (1) the desired compact size of the meter presents a space limitation for housing the value selection and print drum drive mechanisms, the electronics, and the power supply; (2) the print wheel drive mechanism requires high starting and running torques because of the surface and viscous friction from sliding adjacent drive racks and load coupling tolerances.

Given the above mentioned physical characteristics, the critical selection criteria of the prime mover was determined to be its torque-to-size ratio. It must be small enough to fit five units in the value selection-drive mechanism area, and must have enough torque and margin to overcome the opposing load torques at the desired setting (motion) speed. The associated dissipation must be minimized to realize system design objectives, i.e., packaging, cost, power requirement, and reliability. Hence, d.c. motors were selected.

In order to position the digit print wheels correctly in a short and predictable motion time when faced with mechanical and electrical tolerances, the invention utilizes the closed-loop position control system described herein.

The accuracy of the final digit print wheel position is determined by the resolution of the feedback position encoder. To eliminate the effect of motor-load coupling backlash on the digit position accuracy, in accordance with the invention, the encoder is mounted at the load side, i.e., same axis as the pinion gear of the rack and pinion drive. The encoder sensors are positioned along the load axis in such a way that an encoder window (state) is within the capture range of the mechanical rack aligner when the print drum rotates.

Postage Meter System

Postage meter 20 (FIG. 1) according to the present invention includes a microcomputer 22, a printer unit 24, a keyboard/display unit 26 and a power supply unit 28. Microcomputer 22 includes a CPU 29, read only memory (ROM) 30 including nonvolatile ROM, random access or read/write memory (RAM) 31 including battery backed-up RAM (non-volatile RAM), and the following input/output ("I/O") circuitry: keyboard-/display I/O 32; analog monitor/control 33; echoplex I/O 34; logic monitor/control 35 and printing/accounting I/O 36.

Keyboard display unit 26 includes a keyboard 40 for entering postage values and commands for operating postage meter 20, and a display 42 for displaying postage values, commands, messages, etc. Keyboard/display I/O 32 provides an interface for exchange of signals between keyboard 40 and display 42, and microcomputer 22.

Analog monitor/control 33 monitors analog functions and with CPU 29 controls accounting. It receives various regulated and unregulated voltages from power supply unit 28 for powering microcomputer 22 and for monitoring power supply unit 28 communicates with CPU 29, and also receives various signals and outputs various signals internal to microcomputer 22 for ensuring failsafe operation and postage accounting of postage meter 20. Logic monitor/control 35 monitors logic functions and with CPU 29 performs input/output control and decoding. Echoplex I/O 34 with CPU 29 controls an optical input/output port by means of which microcomputer 22 communicates with an external system 46 such as a central system for downloading postage funds to meter 20 and uploading postage usage information from meter 20. Echoplex I/O 34 (including an optical interface) provides complete electrical isolation of microcomputer 22 from any external system 46 coupled thereto via echoplex I/O 34.

Printer unit 24 includes a bank of print wheels 218 (see FIG. 8) mounted to a print drum 217 for printing postage indicia on mail pieces, a digit value selection mechanism 50 which sets the print wheels to print a selected postage value and a print control mechanism 52 which cause the print drum to print the postage value set on the print wheels on a mail piece and monitors structure in printer unit 24 to ensure that postage meter 20 does not print without accounting and does not account without printing. Printing/accounting I/O 36 provides an interface for exchange of signals between digit value selection mechanism 50, print control mechanism 52 and microcomputer 22.

Microcomputer

Figure 2:
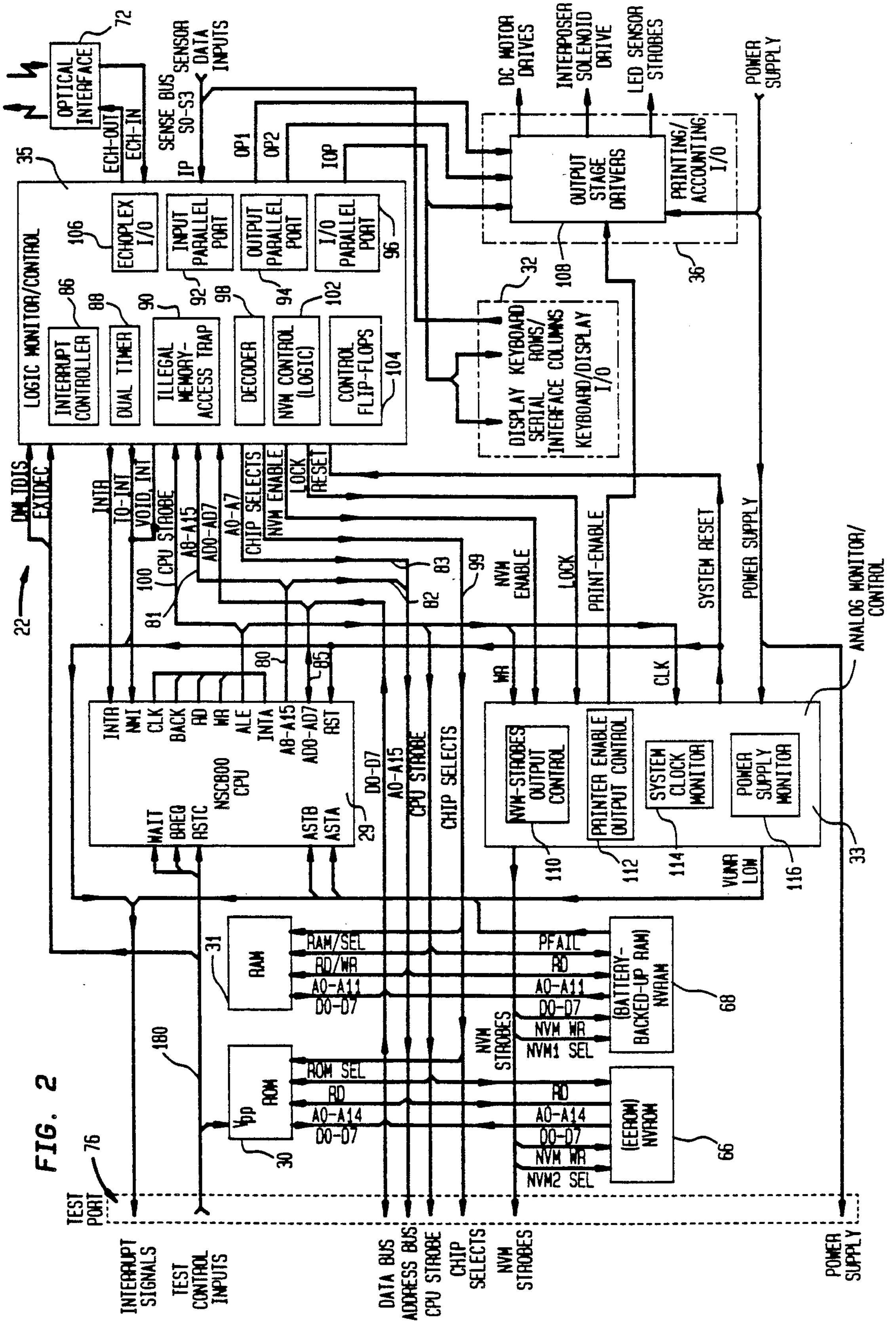
FIG. 2 is a block diagram of a single board microcomputer which forms part of the postage meter depicted in FIG. 1.

Referring to FIG. 2, ROM 30 of microcomputer 22 stores the microcomputer program, RAM 31 stores program data, and the non-volatile memory ("NVM") comprises electrically erasable ROM (EEROM) 66 (hereinafter "NVROM" 66) and battery backed-up RAM 68 (hereinafter "NVRAM" 68). Microcomputer 22 also includes a test port 76. In the presently preferred embodiment, microcomputer 22 is an 8-bit single board microcomputer with an 8-bit multiplexed bus structure and includes a single, multi-tasking CPU 29 embodied by an NSC800 integrated circuit of National Semiconductor Corp., or a 8051 integrated circuit of Intel Corporation, or equivalent.

Microcomputer 22 is a multi-tasking, uniprocessing system which via multi-tasking CPU 29, programming in ROM 30, program data in RAM 31 and I/O's 30-36 sequentially periodically polls postage meter activities and during each poll reacts to the stimulus received from the polled activity, i.e., executes in response to the received stimulus and the stored program. (See FIG. 6. Each of the controlled activities has an I/O control bandwidth, i.e., a maximum response time, which is the sum of the maximum times required for: reading stimulus input data; decoding stimulus raw data; and executing the programmed action. Since CPU 29 polls and executes each activity sequentially, other activities are not serviced during execution of one controlled activity, and wait until the next polling period for servicing the respective activity. However, microcomputer 22 allows each activity when it is polled its maximum bandwidth, if needed, to ensure that the respective activity is under control at all times.

The address bus 80 from CPU 29 is split into lower 81 and upper 82 address buses. Lower address bus 81 is coupled to logic monitor/control 35 which demultiplexes the lower addresses and outputs them on demultiplexed lower address bus 83. The demultiplexed lower address bus 83 and the upper address bus 82 are coupled to memories 30, 31, 66, 68. Bidirectional data bus 85 is coupled to CPU 29, logic monitor/control 35 and memories 30, 31, 66, 68.

Logic monitor/control 35 includes the following microcomputer peripherals: interrupt controller 86 which provides an interrupt signal (INTR) to the INTR interrupt input of CPU 29; dual timer 88 for performing software watchdog functions and providing a interrupt signal (TO-INT) to the non-maskable input (NMI) of CPU 29; an illegal memory address trap 90 which provides a void interrupt signal (VOID INT) to the non-maskable interrupt (NMI) input of CPU 29; input parallel port (IP) 92; output parallel port (OP1,OP2) 94; I/O parallel port (IOP) 96; decoder 98 for decoding and demultiplexing inputs and outputs of logic monitor/-control 35 including lower address bus 81, data bus 85, chip selects 99, CPU strobes 100, input parallel port 92, output parallel port 94, and I/O parallel port 96; NVM control (logic) 102 for supplying non-volatile memory enable signals (NVM ENABLE) to analog monitor/-control 33 for enabling access to NVROM 66 and NVRAM 68; control flip-flops 104 for setting various input, output and internal logic monitor/control signals; and an echoplex I/O port 106 for controlling signal exchange between logic monitor/control 35 and optical interface 72.

Figure 4:
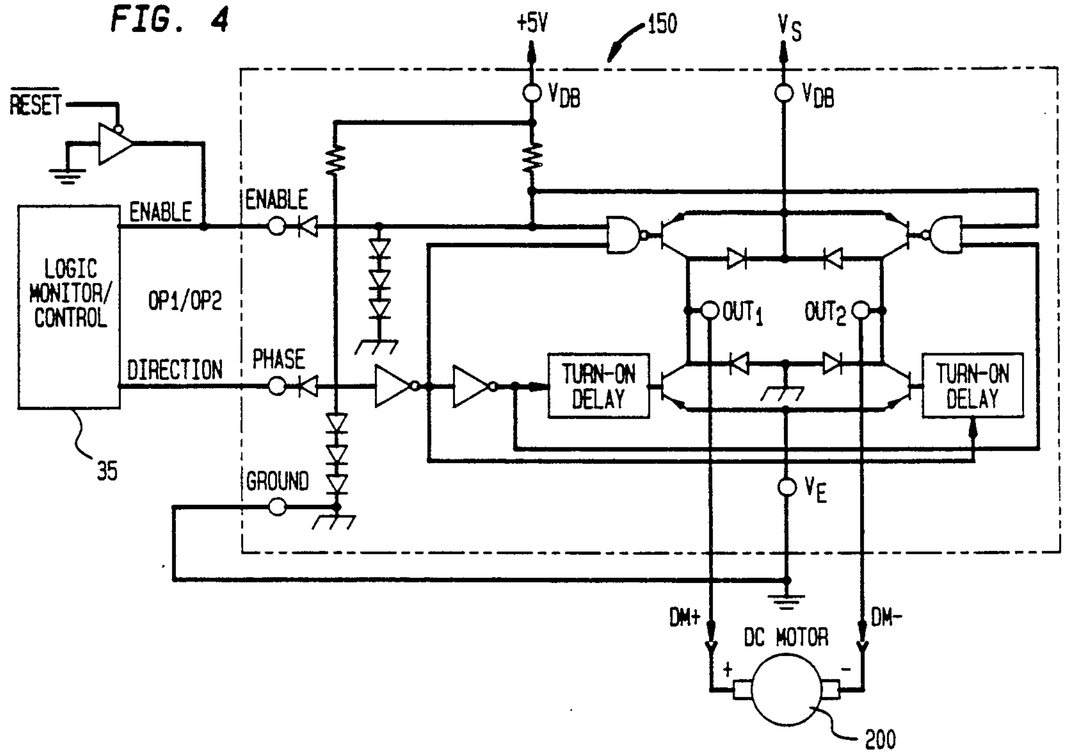
FIG. 4 is a circuit diagram of one of the output stage driver amplifiers which drive d.c. print wheel setting motors in the printer unit of the postage meter of FIG. 1.
Figure 5:
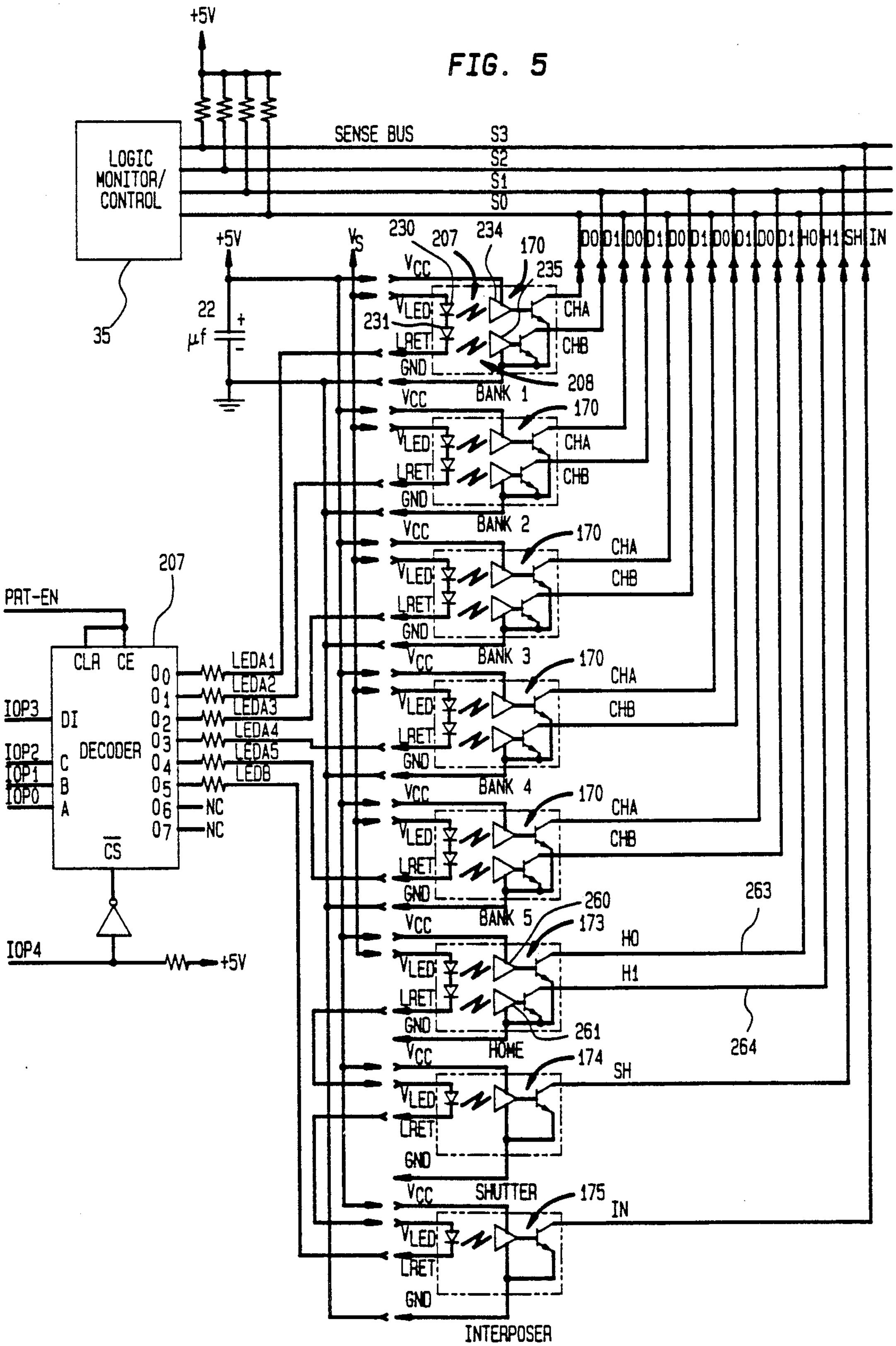
FIG. 5 is a circuit diagram of circuitry in the printer unit for sensing the position of the print wheels and other printer unit structure.

Printing/accounting I/O 36 of microcomputer 22 includes output stage drivers referenced generally by 108 (part of printing accounting I/O 36) which provide: drive signals to the d.c. motor drives in printer unit 24 which set the print wheels (see FIGS. 4, 8 and 9); signals to an interposer solenoid drive for energizing a solenoid which controls the position of an interposer which prevents printing unless it is raised by the solenoid (see FIG. 3); and signals which energize light emitting diode (LED) sensors (see FIG. 5). Inputs from LED sensors in printer unit 24 are input to the input parallel port IP of logic monitor/control 35 via printing/accounting I/O 36.

Dual timer 88 (FIG. 2) in logic monitor/control 35 includes a timer TO which functions as a software watchdog for incorrect (out-of-sequence) program execution. During normal system operation, TO is started and periodically reset to avoid a non-maskable interrupt (NMI) generated by a TO time-out. A timeout interrupt (TO-INT) provided to the non-maskable interrupt input (NMI) of CPU 29 is interpreted by CPU 29 the same as a computer hardware malfunction, and in response thereto, CPU 29 ceases all postage meter control activities, locks access to NVMs 66,68 and the print controls, and then remains in a "halt" state.

Analog monitor/control 33 (FIG. 2), which monitors analog functions and with CPU 29 controls accounting in NVMs 66, 68, includes NVM strobes output control 110, printer enable output control 112, system clock monitor 114 and power supply monitor 116. NVM strobes output control 112 receives the NV ENABLE signals from logic monitor/control 35 and a CPU write (WR) strobe from CPU 29, and outputs NVM strobes to NVROM 66 and NVRAM 68 for controlling reading and writing of NVROM 66 and NVRAM 68. Printer enable output control 112 receives an UNLOCK signal from logic monitor/control 35 and outputs a PRINT ENABLE signal to printing/accounting I/O 36 which enables printing of postage by printer unit 24. System clock monitor 114 receives the CPU CLK (clock) strobe from CPU 29 and provides a SYSTEM RESET to logic monitor/control and to RST input of CPU 29. Power supply monitor 116 receives regulated and unregulated +5 v from power supply unit 28 and provides a SYSTEM RESET when the +5 v regulated supply falls below a predetermined value and a VUNR LOW signal to CPU RSTA and RSTB inputs, respectively, and a SYSTEM RESET when the +5 v unregulated supply falls below a predetermined value.

Microcomputer 22 is fully memory-mapped, hence, every memory and I/O has a defined address within the valid (used) system memory blocks. Access to any void memory address is prohibited. Once an illegal address is decoded by illegal memory access trap 90 of logic monitor control 35 it outputs the VOID-INT signal to CPU 29 to lock all the NVM-access and print controls.

Logic monitor/control 35 blocks any access to the NVMs 66, 68 if it fails the logic requesting such access. In particular, NVM control (logic) 102 keeps the NVM CHIP SELECTS disabled if it fails the CPU's memory-write cycle sequence and keeps the NVM ENABLE strobes inactive if any device chip-select other than the addressed NVM is active, and if the NVM's write-protect latch is enabled (write-disabled).

Figure 3:
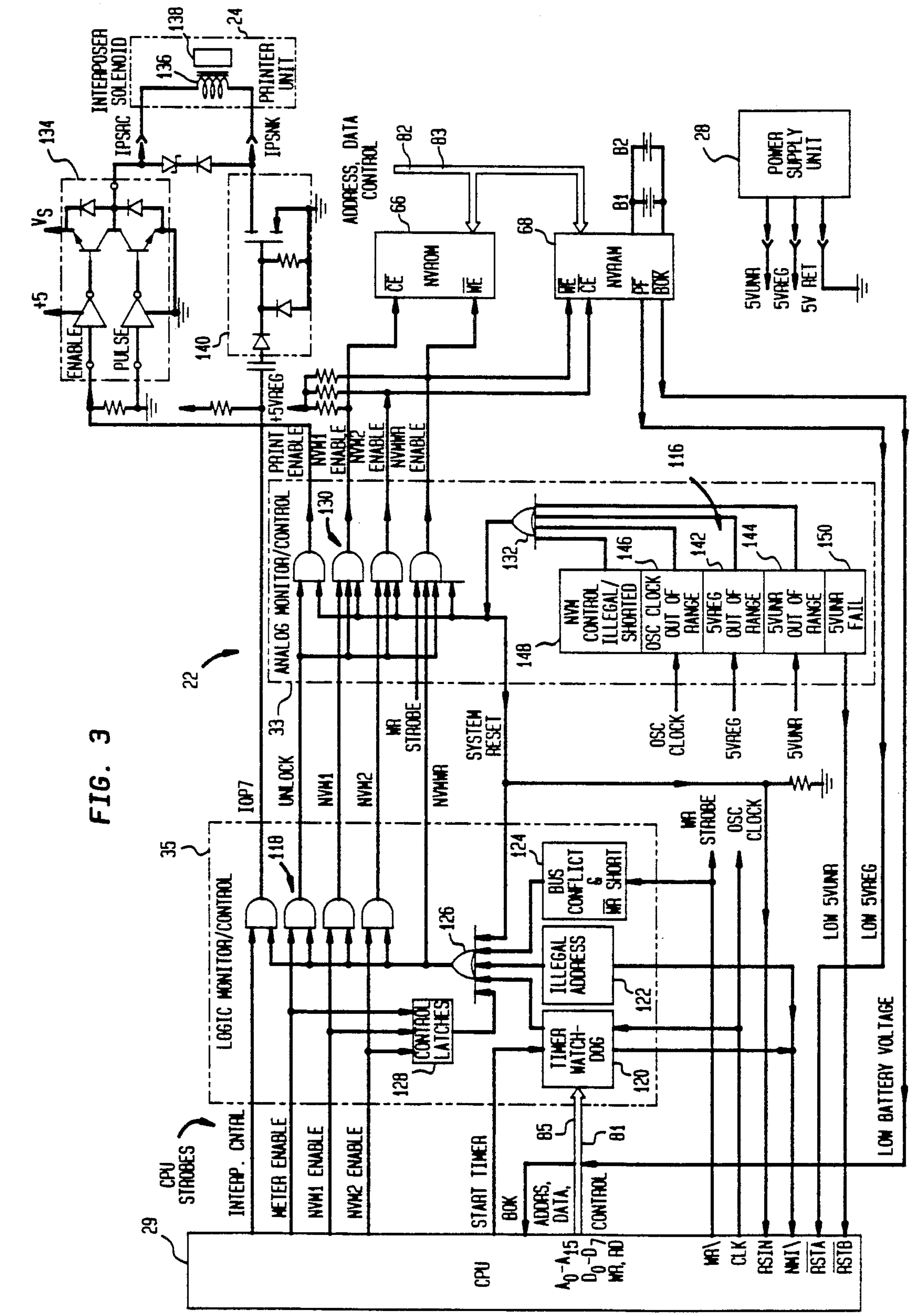
FIG. 3 is a block and circuit diagram of the fault monitoring portion of the microcomputer depicted in FIG. 2.

The specific signals comprising CPU STROBES, CHIP SELECTS, NVM ENABLE, etc., which are shown in either or both FIG. 2 and FIG. 3, are described in more detail below. The fault monitoring portions of postage meter 20, which ensure that postage meter 20 does not print postage if meter 20 can not properly account for it, are described with reference to FIG. 3.

Fault Monitoring And Printing/Accounting Control

NVM control (logic) 102 (FIG. 2) of logic monitor/control 35 includes gating 118 (FIG. 3) which receives the CPU STROBES (INTER CNTRL, METER ENABLE, NVM1 ENABLE, NVM2 ENABLE and START TIMER) and provides NVM write-protection signals (NVM1, NVM2) which are normally active and must be purposely disabled before a write-access is made, and a global lock control (UNLOCK) required for any NVM-access (read or write) and printing which is active upon detection of predetermined faults and is used for immediate shut down of the metering functions. A logic fault monitor system comprising timer watchdog 120 (which contains timer TO of dual timer 88 in FIG. 2), illegal address 122 and bus conflict & $\overline{WR}$ short 124 (both part of illegal memory-access trap 90 in FIG. 2), gate 126 and control latches 128 (part of control flipflops 104 in FIG. 2) forces the NVMI, NVM2 and UNLOCK signals to their default active state (locked) when triggered by the SYSTEM RESET (gate 126 and by signals from circuits 120-124 which indicate a TO timeout, illegal address, bus conflict or $\overline{WR}$ short.

Gating 130 in analog monitor/control 33 (FIG. 3) (corresponding to NVM strobes output control 110 and printer enable output control 112 in FIG. 2) receives the NVM ENABLE strobes NVM1, NVM2 and NVMWR from logic monitor/control 35, the WR strobe from CPU 29 and the SYSTEM RESET from gate 132, and outputs the NVM1 ENABLE, NVM2 ENABLE and NVMWR ENABLE strobes to printer interposer 134 (described below), to NVROM 66 and NVRAM 68. Gating 130 also receives the UNLOCK strobe from logic monitor/control 35 and in response thereto and SYSTEM RESET outputs the PRNT ENABLE strobe to an output stage driver 134, which outputs a source drive IPSRC to solenoid 136 of an interposer 138 (described below) in printer unit 24.

Printer interposer 138, disposed in printer unit 24, prevents printing unless it is raised. The position of printer interposer 138 is controlled by solenoid 136 which when energized raises printer interposer 138 for printing and when de-energized drops interposer 138 to prevent printing. Solenoid 136 is source driven by the IPSRC signal from output stage driver 134, which must be retriggered (pulsed) periodically by PRNT ENABLE to turn it on. Failure to retrigger output stage drive 134 causes it to turn off and de-energize solenoid 136, which causes interposer 138 to drop and prevent printing. The IOP7 output of gating 102 in logic monitor/control 35 is coupled to the output stage driver 140, which supplies a sink drive IPSNK to solenoid 136 to energize it. Control of interposer 138 is thus made redundant in that either output stage driver 134 or switch 140 may be turned off to de-energize solenoid 136 and drop interposer 138.

Analog monitor/control 33 (FIG. 3) forces the NVM-ENABLE strobes (NVM1, NVM2 and NVMWR ENABLES) and PRINT ENABLE to their inactive states and asserts SYSTEM RESET, when the logic power supply inputs, the system clock, and an NVM-access 'window' (time period of active state) ar outside their specified operating limits. These out of range conditions are determined by power supply monitor circuitry 142 and 144 (FIG. 3) (part of power supply monitor 116 in FIG. 2), which respectively receive the +5 v regulated input and the +5 v unregulated input from power supply unit 28 and provide out of range signals to gate 132, by system clock monitor 146 which provides a signal to gate 132 when the system oscillator clock output by CPU 29 is out of range, and by NVM control illegal/shorted 148 which provides an output to gate 132 when the NVM access strobes are illegal or shorted. Power supply monitor 116 also includes 5VUNR fail circuit 150 which provides a low 5VUNR signal to the RST B input of CPU 29 when the +5 v unregulated input voltage is low. When active, the RST input causes CPU 29 to go into internal write protect mode.

NVM control illegal/shorted circuit 140 of analog monitor/control 33 (FIG. 3) provides the access 'window' referred to above (e.g., sixteen system clock cycles) for the NVM-access strobes, both at the input and output signals, to detect any logic "0" short-circuit (stuck-active) on these lines. Once detected, NVM-access and print-enable are blocked by keeping the control outputs in inactive state.

Analog monitor/control 33 activates the SYSTEM RESET and sets the NVM-access and PRNT ENABLE control outputs to their inactive states when it detects that the supply voltage, or the system clock is beyond its normal operating limit. During power down, the system is reset at a supply voltage level within the stable operating condition of microcomputer 22, and the NVM-access strobes and print-enable are held stable even at low voltage levels while the rest of the system becomes unstable.

Analog monitor/control 33 outputs the SYSTEM RESET to the RSIN input of CPU 29 and to gate 126 in logic monitor/control 35, and provides a time delay (e.g., 131 ms) for every activation of the system reset signal.

Each NVM 66, 68 has an independent write-protect latch in logic monitor/control 35 (control latches 128) which is disabled when deliberate Writing to the specific NVM is to be executed; otherwise, the write-protect latches for both NVMs are enabled (default state), blocking any random write-access to the NVMs.

Access to NVMs 66, 68 and printing are normally inhibited by an unlock-enable latch (control latches 128 in FIG. 3) which is enabled (unlocks) only during a normal program execution, i.e., gating 118 in logic monitor/control 35 (FIG. 3) outputs an active UNLOCK signal. Any detected failure sets this latch to its default disabled (locked) state, and causes logic monitor/control 35 to disable the UNLOCK signal.

Outputs $\overline{\text{PF}}$ and $\overline{\text{BOK}}$ from NVRAM 68 are coupled to inputs $\overline{\text{RSTA}}$ and $\overline{\text{BOK}}$, respectively, of CPU 29 which monitors NVRAM 68 for low +5V regulated voltage and low battery voltage. In response to an active signal on those lines, CPU 29 locks postage meter 20 as described above.

NVM's 66, 68 provide redundant data storage to avoid losing critical accounting data in a single-point failure. For the same reason, two redundant batteries, B1 and B2, for the battery backed-up NVMRAM 68, and two complementary control lines IPSRC and IPSNK are provided for interposer solenoid 136.

In additional to output stage drivers 134 and 140 depicted in FIG. 3 and discussed above, output stage drivers 134 depicted in FIG. 4 are provided as drive amplifiers for driving the d.c. motors in printer unit 24. One such driver 134 is provided for each d.c. motor 200 to be controlled. FIG. 5 depicts the sensors in printer unit 24 for sensing the position of the print wheels and the positions of the printer interposer, shutter and print drum. Further description of control of the d.c. motors 200 is made below.

Microcomputer 22 (FIG. 2) also includes a test port 76 which may include test inputs (bus 180) to CPU 29 and logic monitor/ control 35 (for example, for memory accessing, use of external program memory, etc.) in addition to terminals for monitoring selected microcomputer signals, as for example depicted in FIG. 2.

Echoplex I/O 94, optical interface 72 and keyboard-/display I/O 32 may be conventional and are known or may be constructed by those of skill in the art, or specially designed for postage meter 20.

System Multiplexing Operation

Figure 6:
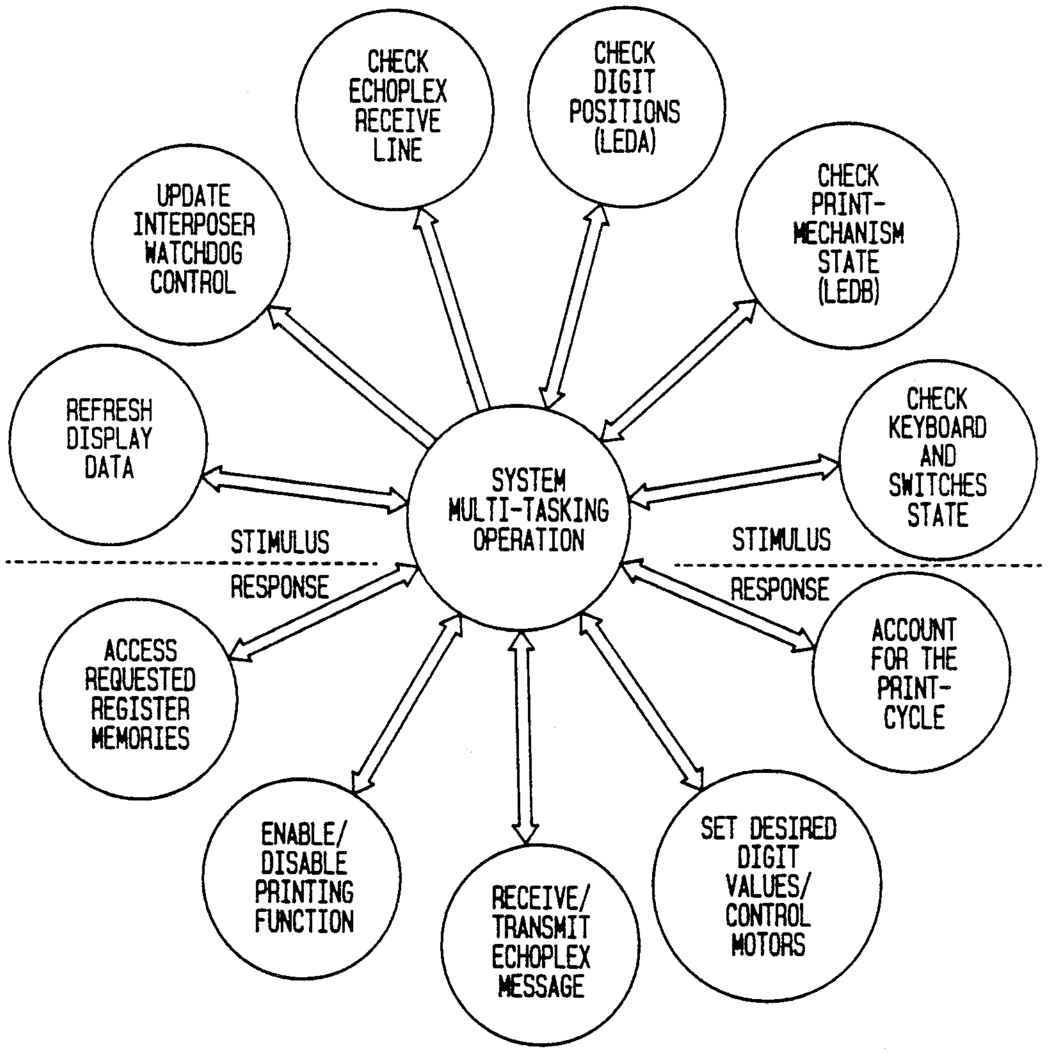
FIG. 6 is a block diagram illustrating multi-tasking operation of the postage meter depicted in FIG. 1.
Figure 7:
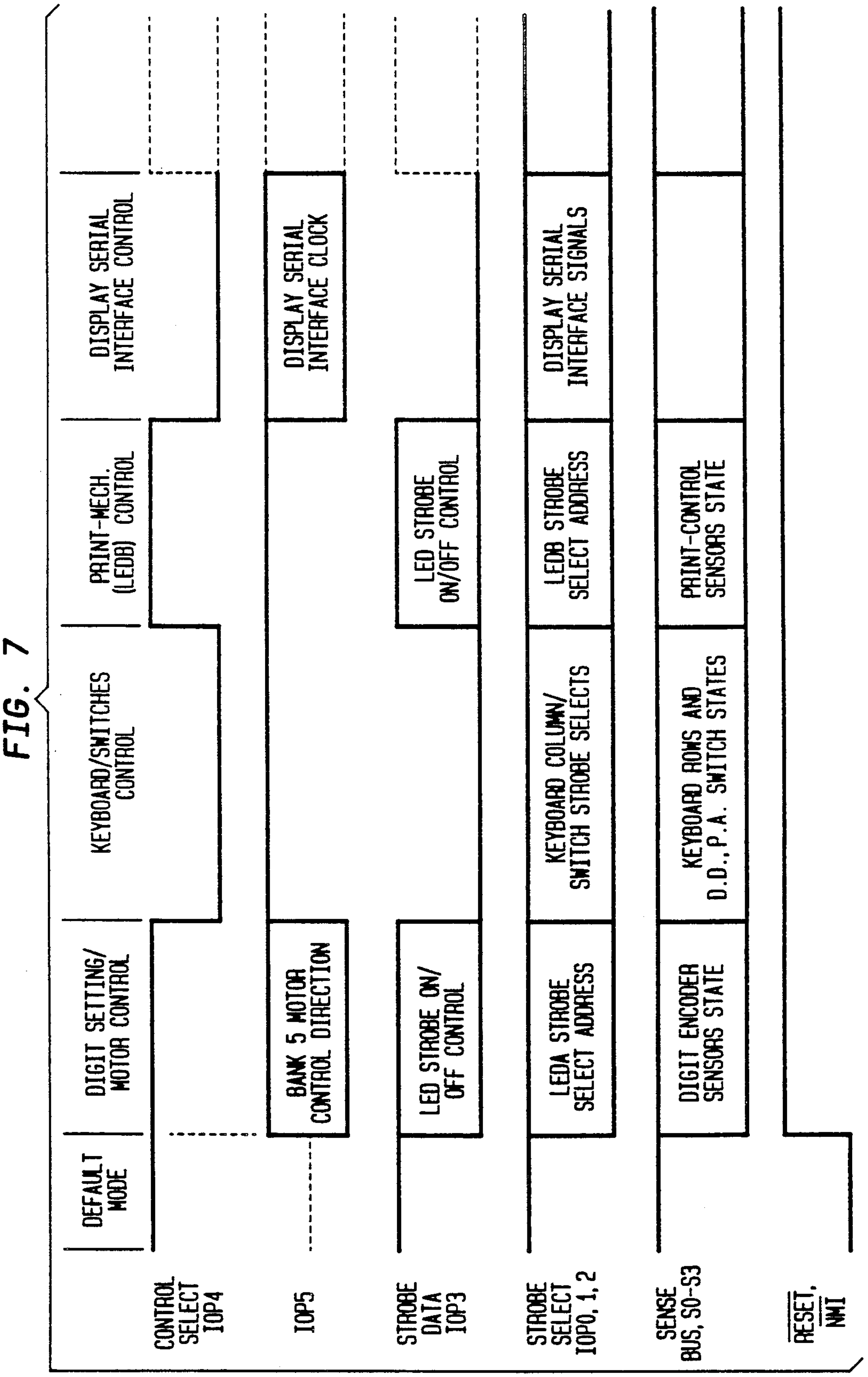
FIG. 7 is a timing diagram illustrating system I/O multiplex control timing of the postage meter depicted in FIG. 1.

As discussed above, microcomputer 22 is a multitasking system, and the various activities of postage meter 20 are polled and executed in accordance with the system multi-tasking diagram depicted in FIG. 6. Microcomputer 22 multiplexes the input/output port (IOP) and sense bus (SO-S3) of logic monitor/control 35 as shown in FIG. 7, and controls input/output signals as set forth in Table I below.

Logic monitor/control 35 through ports OP1, OP2 and IP (FIG. 2) provides the drive to output stage power drivers 134. Table I below lists the functional assignments of the ports and their corresponding control states.

TABLE I

| | | |
|---|---|---|
| Outputut Port OP1 | | |
| OP10 = Bank 1 digit motor drive (DM1) enable | 1 = ON | 0 = OFF |
| OP11 = Bank 1 digit motor drive direction | 1 = INCR | 0 = DECR |
| OP12 = Bank 2 digit motor drive (DM2) enable | 1 = ON | 0 = OFF |
| OP13 = Bank 2 digit motor drive direction | 1 = INCR | 0 = DECR |
| Output Port OP2 | | |
| OP20 = Bank 3 digit motor drive (DM3) enable | 1 = ON | 0 = OFF |
| OP21 = Bank 3 digit motor drive direction | 1 = INCR | 0 = DECR |
| OP22 = Bank 4 digit motor drive (DM4) enable | 1 = ON | 0 = OFF |
| OP23 = Bank 4 digit motor drive direction | 1 = INCR | 0 = DECR |
| Input Port IP | | |
| IP0 = Multiplexed Sense Bus bit S0 | 1 = "dark" for LEDs | |
| IP1 = Multiplexed Sense Bus bit S1 | 1 = function inactive for postage meter keyboard/switch | |
| IP2 = Multiplexed Sense Bus bit S2 | 0 = "light" for LEDs | |
| IP3 = Multiplexed Sense Bus bit S3 | 0 = function active for postage meter keyboard/switch | |

Input/Output Port IOP

IOP0 = LED strobe-select address bit 0 (LSB) when IOP4 = 1 and IOP5 is used as DM5 direction
= keyboard/switch strobe-select address bit 0 (LSB) when IOP4 = 0 and IOP5 is set high TABLE I-continued

| | |
|---|---|
| | = display interface serial data output port when IOP4 = 0 and IOP5 is used as display serial interface clock output port |
| IOP1 | = LED strobe-select address bit 1 when IOP4 = 1 and IOP5 is used as DM5 direction |
| | = keyboard/switch strobe-select address bit 1 when IOP4 = 0 and IOP5 is set high |
| | = display interface command/data output port when IOP4 = 0 and IOP5 is used as display serial interface clock output port |
| IOP2 | = LED strobe-select address (MSB) when IOP4 = 1 |
| | = keyboard/switch strobe-select address (MSB) when IOP4 = 0 |
| IOP3 | = LED-strobe drive control 1 = ON 0 = OFF |
| IOP4 | = Output stage strobe-control select<br>1 = selects the active (LED) sensors strobe control and disables the display serial interface control.<br>0 = selects the passive (keyboard/switch) sensors strobe control and enables the display serial interface control. |
| IOP5 | = Bank 5 digit motor drive direction 1 = INCR 0 = DECR when IOP4 = 1 |
| | = display interface clock output port 0 = active when IOP4 = 0 |
| IOP6 | = Bank 5 digit motor drive (DM5) enable 1 = OFF 0 = ON |
| IOP7 | = Interposer sink drive (IPSNK) control |

Some IOP lines and/or combinations of lines may be used for two different functions in different I/O's provided that an other signal, such as a clock, required for execution of one of the two functions is inhibited to prevent execution of the non-selected function.

Accounting And Printing

Print wheels 218 (see FIG. 8) are mounted to a print drum 217, and the print drum is driven by a motor 219 controlled by microcomputer 22 to print postage as described herein and in patents cited herein.

In order that postage meter 20 not print without accounting and not account without printing, the mechanical drive system for the print cycle is uni-directional and allows only one cycle of printing until interposer drive 134 (FIG. 3) is reset. Additionally, a shutter bar (not shown) resets and locks the drive mechanism when the drive mechanism is driven to its home position and allows print drum 217 carrying print wheels 218 (FIG. 8) to be tripped for printing when driven forward. Sensor 174 (FIG. 5) via signal SH indicates the position of the shutter bar, sensor 175 via signal IN indicates the position of the interposer and sensor 173 via signals H0 and H1 (FIGS. 5 and 8) indicates the three states of the print drum position: home one state (drum within detent home position); rotated state, drum out of detent home position; and home two state, drum within detent home position. The interposer mechanism blocks the shutter bar from being driven forward when in the down position (printing disabled) and allows the shutter bar to move forward when in the up (printing enabled) position.

The outputs H0, H1, SH and IN of sensors 173–175 (FIGS. 5 and 8) are read from the sense bus, S3-SO through the LEDB strobes. Table II below defines the system response to the possible states of the sense bus.

TABLE II

| IN S3 | SH S2 | H1 S1 | H0 S0 | Mechanism State | | | System Action Response |
|---|---|---|---|---|---|---|---|
| 0 | 0 | 0 | 0 | IN = down; | SH = frwd; | H = invalid | R1 |
| 0 | 0 | 0 | 1 | IN = down; | SH = frwd; | H = home 1 | R2/R5/R6 |
| 0 | 0 | 1 | 0 | IN = down; | SH = frwd; | H = home 2 | R2/R5/R6 |
| 0 | 0 | 1 | 1 | IN = down; | SH = frwd; | H = tripped | R4 |
| 0 | 1 | 0 | 0 | IN = down; | SH = home; | H = invalid | R1 |
| 0 | 1 | 0 | 1 | IN = down; | SH = home; | H = home 1 | R2/R6 |
| 0 | 1 | 1 | 0 | IN = down; | SH = home; | H = home 2 | R2/R6 |
| 0 | 1 | 1 | 1 | IN = down; | SH = home; | H = tripped | R4 |
| 1 | 0 | 0 | 0 | IN = up; | SH = frwd; | H = invalid | R1 |
| 1 | 0 | 0 | 1 | IN = up; | SH = frwd; | H = home 1 | R3/R5/R6 |
| 1 | 0 | 1 | 0 | IN = up; | SH = frwd; | H = home 2 | R3/R5/R6 |
| 1 | 0 | 1 | 1 | IN = up; | SH = frwd; | H = rotated | R7 |
| 1 | 1 | 0 | 0 | IN = up; | SH = home; | H = invalid | R1 |
| 1 | 1 | 0 | 1 | IN = up; | SH = home; | H = home 1 | R3/R6 |
| 1 | 1 | 1 | 0 | IN = up; | SH = home; | H = home 2 | R3/R6 |
| 1 | 1 | 1 | 1 | IN = up; | SH = home; | H = rotated | R4 |

System Action Response Definition:

R1: Invalid state. The home (print cycle) sensor 173 2-bit state cannot assume a '00' state regardless of the interposer and shutter bar positions because a print cycle encoder disc does not allow this state. This condition only occurs if both channel of the home sensor are stuck active, or, the encoder disc is not aligned correctly to the sensor.

R2: Valid state. This is the valid disabled state of the printer unit 24 where the interposer is down (IN = 0) blocking the shutter bar, thereby preventing the print drum to be TABLE II-continued

| | |
|---|---|
| | rotated (tripped). A '01' or '10' home sensor 173 2-bit state indicates print drum home conditions (home 1 and home 2, respectively). If this home condition is different from the last known state during power-up, then see response R6 to account for the missed print-cycle. Otherwise, at this state, the system does not respond to the shutter bar position, i.e., forward (SH = 0) or home (SH = 1); however, see response R5 for operational fault condition. |
| R3: | Valid state. This is the valid enabled state of the printer unit where the interposer is up (IN = 1) freeing the shutter bar to move all the way forward allowing the drum to be tripped for printing. A '01' or '10' home sensor 173 2-bit state indicates print drum home conditions (home 1 and home 2, respectively). If this home condition is different from the last known state during power-up, see response R6 to account for the missed print-cycle. Otherwise, at this state, the system does not respond to the shutter bar position, i.e., forward (SH = 0) or home (SH = 1); however, see response R5 for operational fault conditions. |
| R4: | Invalid state. A '11' home sensor 173 2-bit state indicates that the drum is tripped for printing; however, the interposer, or/and, the shutter sensors 175, 174 state indicates that this is mechanically impossible to occur because the print drum cannot be tripped if the interposer is down (IN = 0) blocking the shutter bar to freely move forward, or if the shutter bar is home (SH = 1) locking the drum drive gear into place. This condition only occurs if one or both channels of the home sensor 173 becomes defective, i.e., stuck-off, or if there is a breakage in the mechanical drive system. |
| R5: | Valid state. This is a valid operational fault condition of the printer unit where the interposer fails to drop (IN – 1) because the shutter bar position is forward (SH = 0), or, regardless of the interposer position (IN = 0 or 1), the shutter bar is forward during system power-up. Both conditions require manual resetting of the printer unit to bring the shutter bar to its home position (SH = 1). |
| R6: | Valid state. During power-up initialization, regardless of the state of the other sensors, if the home sensor 173 state is different from its last known state, then response R7 is triggered because the system concludes that a print-cycle had occurred, or had been initiated while the system is reset, i.e., no power. |
| R7: | Valid state. This is the one-and-only state, when the system is enabled, that triggers the system to account for the amount set in the digits of the five print wheels and updates the accounting records in both NVMs. One accounting cycle is about 220 ms. |

Specific Circuitry and Programming

Accounting with respect to loading postage meter 20 with postage and maintaining values of postage printed, postage remaining, etc., may be conventional, and programs for causing microcomputer 22 to perform such accounting may be constructed by those of skill in the art. U.S. Pat. No. 4,731,728, cited above, discloses a postage meter having a shutter, an interposer and postage accounting.

The following U.S. Patents, all assigned to the assignee of this application, disclose analog monitor/control circuitry, logic monitor/control circuitry and fault monitoring circuitry which may be used in the postage meter disclosed herein: 4,675,550 (Hafner), 4,686,388 (Hafner), 4,698,829 (DiGiulio), 4,701,856 (DiGiulio et al.), 4,706,159 (Hafner), 4,710,882 (DiGiulo et al.), 4,746,818 (Hafner) and 4,747,057 (DiGiulio et al.). The discloses of all of the patents cited immediately above are incorporated herein by reference.

Circuitry and programming for carrying out the functions described above may be constructed by those of skill in the art from the disclosure herein and the disclosures of the U.S. patents incorporated herein by reference.

D.C. Motor Control

Figure 8:
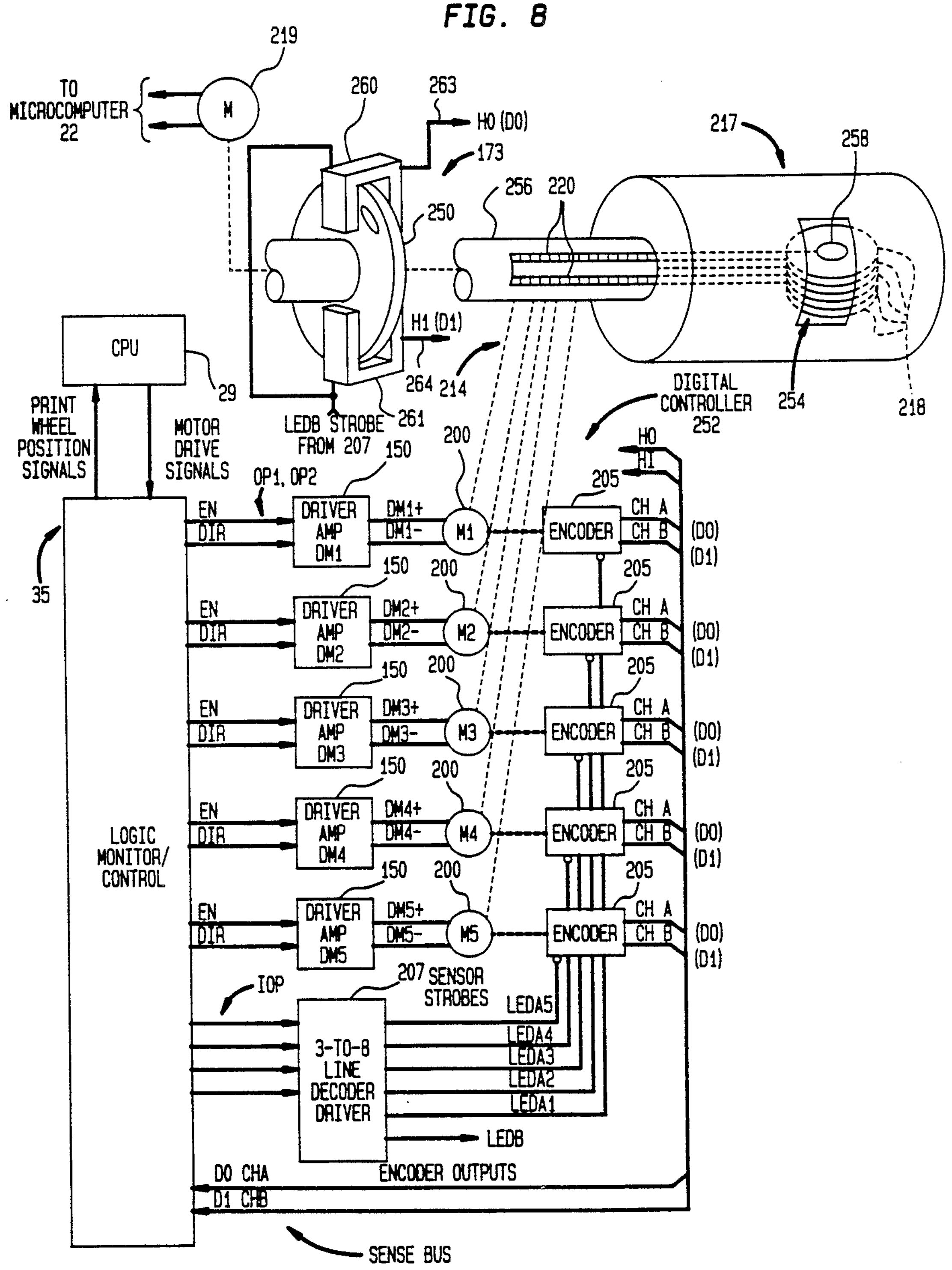
FIG. 8 is a hardware block diagram of servo control loops implemented by the microcomputer depicted in FIG. 2 for controlling the print wheel setting d.c. motors.

Referring to FIG. 8, postage meter 20 includes a plurality of print wheels 218, mounted to a print drum 217, whose positions are set by a digital controller 252. Print drum 217 is rotated through a printing area 254 by a motor 219 controlled by microcomputer 22. Print drum 217 is rotated between home positions by motor 219 to print the postage set on the print wheels 218 on a mail piece presented in area 254. Sensor 173 detects the two home positions of print drum 219. Sensor 173 may comprise optical sensors 260, 261 which sense the position of an optical variation (e.g. hole) in a wheel 250 connected to print drum 217. For example, print drum 217 is in one home position when the outputs 263, 264 (H0, H1) of sensors 260, 261 are "01" and in the other home position when outputs 263, 264 are "10". When outputs 263, 264 are "11", drum 63 is in a rotated position between home positions.

Figure 9:
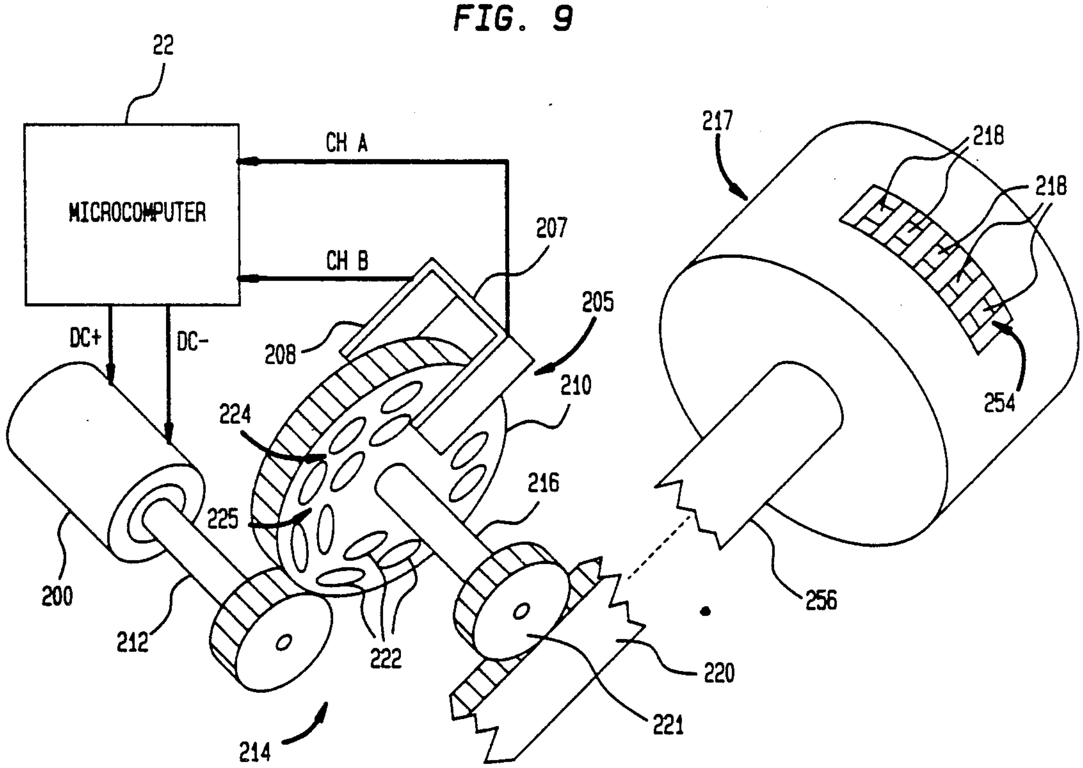
FIG. 9 is a diagram of a portion of the drive mechanism for setting the position of one of the print wheels including an encoder for providing signals related to the position of the print wheel.

Referring to FIGS. 8 and 9, the position of print wheels 218 is set by d.c. motors 200, which are coupled to respective print wheels 218 by gearing 214 and a rack and pinion drive 220, 221. The racks 220 are disposed in print drum shaft 256, two on one side thereof as shown in FIG. 8, and three on the other side thereof. The racks 220 extend within shaft 256, to engage print wheel pinion gears 258 (FIG. 8) attached to respective print wheels 218.

In order to reduce space requirements, print wheels 218 are not locked when power to meter 20 is off, as described for example in U.S. Pat. No. 4,731,728 referenced above. In order to further reduce space requirements, print drum home sensor 173 coder sensors 205 are coupled between respective d.c. motors 200 and respective rack and pinion drives 220, 221. A 10 to 1 gear ratio is provided by gearing 214 between respective motors 200 and rack and pinion gear drives 220, 221. This load transfer ratio provides an accuracy of ¼ motor shaft revolution, which is sufficient for alignment of racks 220 in print drum shaft 256 by a mechanical aligner plate (not shown). The mechanical aligner plate simply aligns the racks relative to each other so that the teeth of all the racks are in alignment, i.e., a particular rack may be moved to +/−½ tooth to align it with other racks. This ensures that the print wheels are all aligned relative to each other at full digit positions for printing.

The accuracy of the digital position of print wheels 218 is determined by the resolution of the incremental encoder 205. To eliminate the effect of motor-load coupling backlash on the digital position accuracy, the encoder 205 is mounted at the load side, i.e., on the same axis as pinion gear 220. The encoder wheel 210 is positioned along the load axis in such a way that an encoder window (state) is within the capture range of the mechanical aligner plate (not shown) to provide full-digit positions of the print wheels, as described above, when the print drum rotates. The final position stability control is provided by controller 220. For each "do motor control loop", controller 220 processes the positional and direction information from the encoder 205 and outputs the 37 do motor electrical drive" based on the difference between the desired and actual positions of the print wheel.

Figure 13:
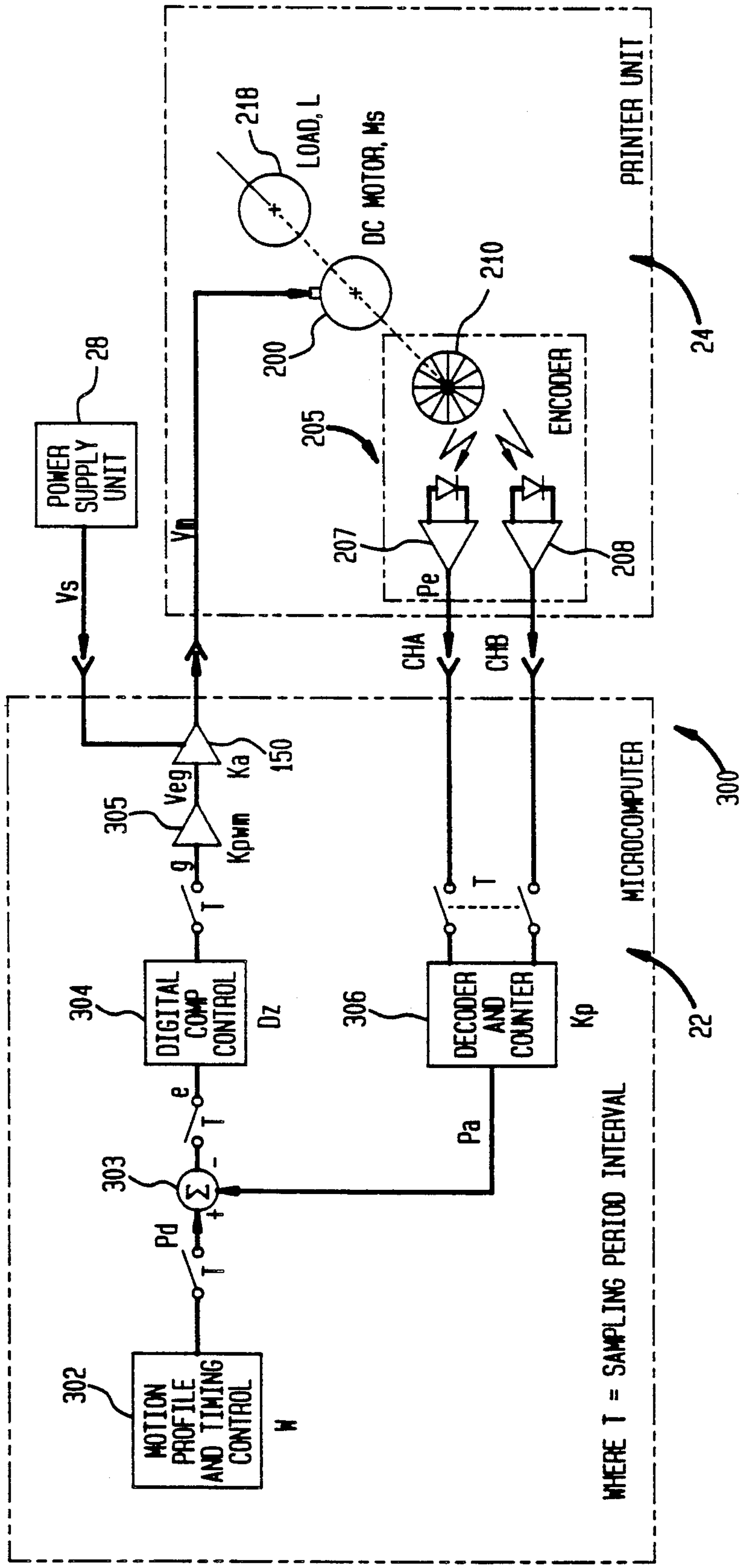
FIG. 13 is a functional block diagram of the servo loop implemented in part by the microcomputer depicted in FIG. 2.

Controller 220 includes microcomputer 22, (CPU 29 and logic monitor/control 35, d.c. motors 200 (one for each print wheel 218, incremental (relative) position encoders 205 (one for each d.c. motor 200), and motor drive amplifiers 134 (one for each d.c. motor 200). If desired, drive amplifiers 134 may be provided as part of microcomputer 22. Each motor 200 is operated via a closed servo loop implemented in part by microcomputer 22, drive amplifiers 134 and encoders 205. Digital controller 220 contains five parallel software driven servo systems, a functional block diagram of each of which is depicted in FIG. 13.

FIG. 8 depicts of the control loop for each of the print wheel setting d.c. motors 200. Each control loop includes a driver amplifier 134, a d.c. motor 200 and a position encoder 205. Logic monitor/control 354 outputs motor enable (EN) and direction (DIR) drive signals generated by CPU 29 to driver amplifiers 134 which output complementary source (DM1+ to DM5+) and sink (DM1− to DM5−) drive signals to drive respective motors to move respective print wheels towards respective desired positions. Position encoders 205 in response to sensor strobes LEDA1 - LEDA5 provide respective quadrature output signals on CH A and CH B (D0 and D1) to logic monitor/control 35 for input to CPU 29. Logic monitor control 35 provides the sensor strobes on input/output port lines IOP0–IOP3 (FIG. 5) to a 3 to 8 line decoder 207 which provides the decoded sensor strobes LEDA1–LEDA5 and a sensor strobe LEDB for interposer sensor 176. The quadrature CH A and CH B output signals D0 and D1 from encoders 170 are input to sense bus S0–S3.

The input data sense bus S0–S3 is a 4-bit input data bus which comprises the optical sensor outputs and switch poles of printer unit 24, connected as OR inputs for multiplex sampling by microcomputer 22. The data in the sense bus at any given time represents the output channels of the strobed sensors. Hence, if there is no strobe active, the sense bus lines are pulled-up to logic "1" state. For an optical sensor output, a logic "0" at the sense line indicates an uninterrupted LED light source: a logic "1" indicates an interrupted (blocked) light source.

Referring next to FIGS. 4, 5 and 8, in response to drive motor enable (EN) and direction (DIR) signals output by logic/monitor/control 35 on output ports OP1 and OP2, respective output stage drive amplifier 134 output complementary position motor drive signals DM1+ to DM5+ and negative motor drive signals DM1− to DM5− to control the five d.c. motors 200 (M1–M5) of digit value selection mechanism 50 (FIG. 1). The positive output (DM1+ to DM5+) of driver amplifier 134 is connected to the positive terminal of the respective motor 200 and the negative output (DM1− to DM5−) is connected to the negative terminal of the respective motor. The outputs of driver amplifier 134 are complementary so that when one is high (Vs), the other is low, and the high output acts as a source while the low output acts as a sink. When its positive output is high, driver amplifier 134 provides a digit-decreasing drive to the respective motor, and when its negative output is high, driver amplifier 150 provides a digit increasing drive to the respective motor.

The LEDA1–LEDA5 signals (FIG. 5) are sink strobe signals that demultiplex the outputs of the encoders 205 of the five motors or banks, bank #1 (LS bank) to bank #5 (MS bank), respectively, from the multiplexed input sense bus S0–S3. When any of the strobes is active, the corresponding state of the digit encoder output, D0 and D1, are present at the S0 and S1 lines of the sense bus, respectively. These open-collector outputs are normally off (open) except when sampling the digit encoder positions.

The LEDB strobe is a sink drive which, demultiplexes the state of the home, shutter, and interposer sensor outputs from the sense bus S0–S3, respectively. The open-collector output is normally off (open) except when sampling the state of the printmechanism (LEDB) group of sensors.

Figure 10:
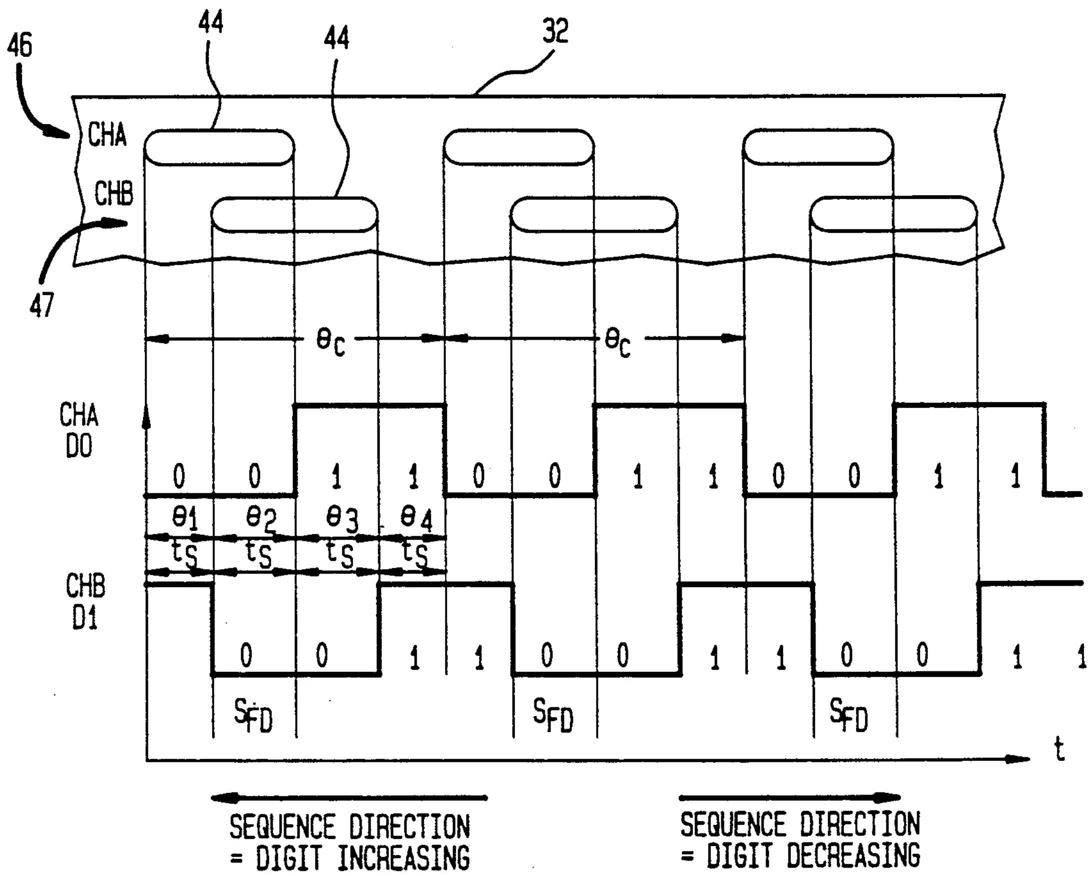
FIG. 10 is a diagram illustrating generation of the position feedback signals by the encoder depicted in FIG. 9.

Referring to FIGS. 8, 9 and 10, each print wheel position, encoder 205 includes a CH A sensor 208 and a CH B sensor 209 and a position encoder wheel 210 (FIG. 9) coupled to the shaft 212 of a respective motor 200 by gearing 214. Shaft 216 of encoder wheel 210 is coupled to a respective print wheel 218 by a rack and pinion drive 220, 221. Thus, the angular position of print wheel 218 is related to the angular position of encoder wheel 210, which is sensed by means of slotted openings 222 in wheel 210 arranged in outer circular series 224 (CH A) and inner circular series 225 (CH B) and sensors 208, 209.

Slotted openings 222 have equal circumferential widths and are equidistantly, angularly spaced along the circumference of respective concentric circles. Slotted openings 222 in inner and outer series 225 (CH A) and 224 (CH B) are radially spaced and circumferentially offset by a substantial amount but less than by 180°. In the preferred embodiment, they are offset by 90°. This doubles the number of encoder states available over a single series of openings. The CH A and CH B output lines 227, 228 (D0, D1) from sensors 208 and 209 are coupled to quadrature decoder and counter 306 in microcomputer 22 which supplies the motor drive signals DM+, DM− to motor 200 on the EN and DIR lines and via amplifier 22.

Sensors 208 and 209 (FIG. 5) each comprise a light emitting diode (LED) 230, 231 and a photo transistor 234, 235, respectively. LEDs 230, 231 are selectively connected in series with a source of power via microcomputer 22 and are positioned as reference points for wheel 210 on one side thereof to project light through a respective series 224, 225 of slotted openings 222. Transistors 234, 235 are positioned on the other side of wheel 210 to receive light projected through respective series 224, 225 of slotted openings 222. Transistors 234, 235 are connected a switches with their emitters connected to ground and their collectors coupled to microcomputer 22 as the CH A output line 227 and CH B output line 228. These outputs are sensed by microcomputer 22 to determine when slotted openings 222 pass the reference points of LEDs 230, 231, i.e., when transistors 234, 235 are switched on (logic "0" state on the respective line 227 or 228) by light from LEDs 230, 231.

The signals obtained from sensors 208, 209 appearing on the CH A and CH B lines (D0, Dl lines, respectively in FIG. 5) are shown in FIG. 10. The CH A and CH B sensor signals are quadrature decoded as described below in connection with FIG. 16 to give the actual position of the respective print wheel. FIG. 10 also shows the relationship between the encoder quadrature and electrical degrees including encoder state switching points in electrical degrees and transition times for encoder states.

Figure 11:
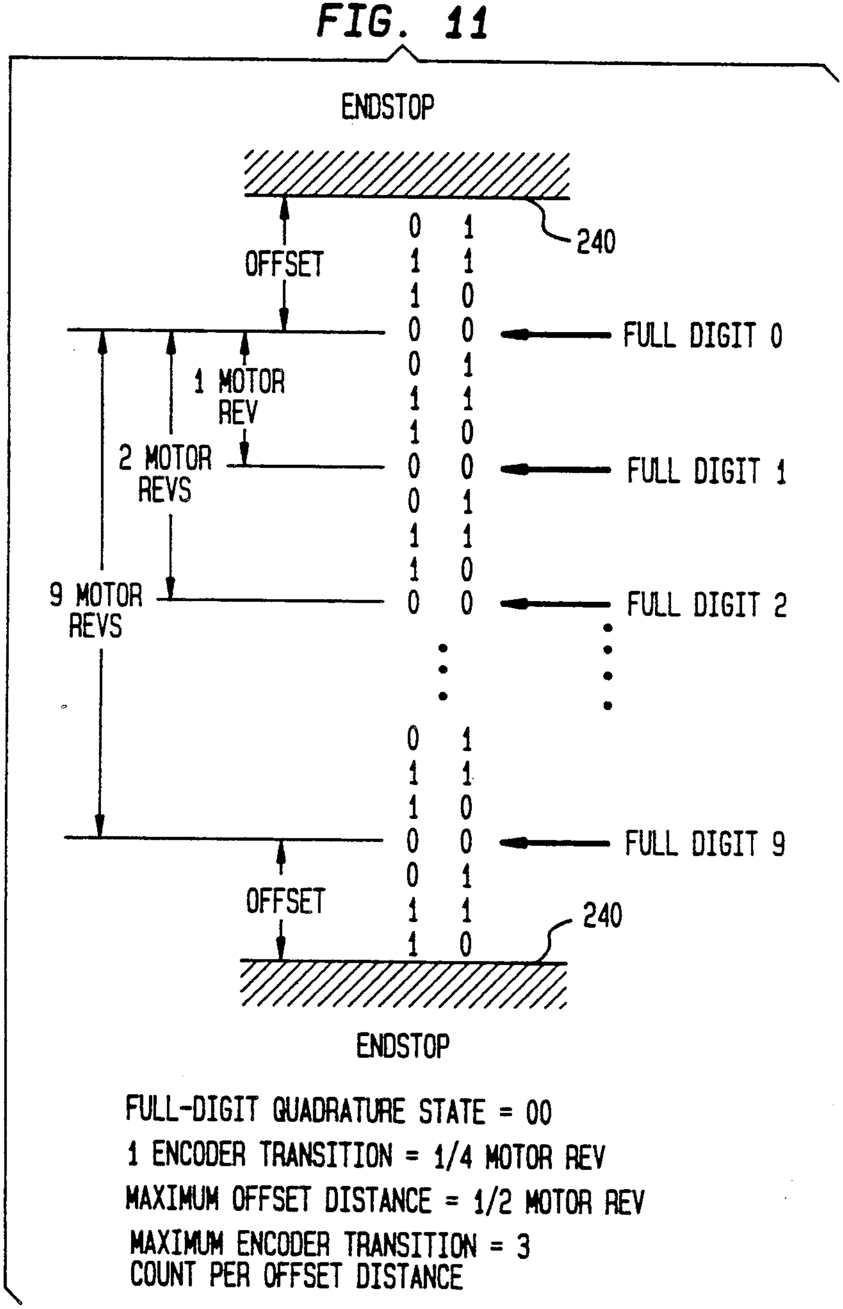
FIGS. 11 and 12 are diagrams illustrating the relationship of the output signal of an encoder, the d.c. motor shaft position, and corresponding print wheel value digits.
Figure 12:
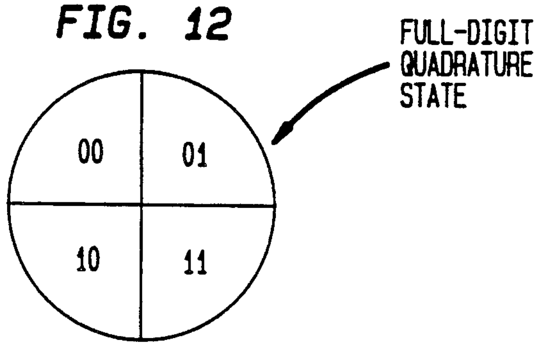

Referring to FIGS. 10, 11 and 12, one revolution of motor 200 corresponds to a full-digit quadrature state, and nine motor revolutions are required to set a print wheel to all of its digit values, 0–9. Correspondingly, an encoder transition is equal to ¼ motor revolution. Each print wheel is rotatable between end stops 240, offset from the "0" and "1" digits by a maximum offset distance corresponding to one half motor revolution, which in turn corresponds to a maximum of three encoder transitions. All full digit quadrature states are "00" ("$S_{FD}$") states.

Referring to FIG. 13, each servo loop 300 includes the following: a motion profile and timing control 302 (W), a summing junction 303, a digital compensation control or filter 304 (Dz), a pulse width modulator (PWM) 305 (Kpwm), an output stage drive amplifier 134 (Ka), encoder sensors 208, 209, encoder wheel 210 and an encoder state quadrature decoder and counter 306 (Kp). The output stage drive amplifier 134 is shown incorporated within the microcomputer 22, but may physically be located externally of the microcomputer 22 depending on space requirements, etc.

Motion profile and timing control 302, summing junction 303, digital compensation control 304, pulse width modulator 305 and encoder state quadrature decoder and counter 306 illustrated in FIG. 13 as hardware are implemented by CPU 29 and software. Encoder sensors 208, 209 provide digital signals directly, as described in connection with FIGS. 5 and 9–12, and PWM circuit 305 provides digital d.c. motor drive signals s that loop 300 does not require an analog-to-digital converter and a digital-to-analog converter. Desired position information contained in motion profile and timing control 302 may be entered by means of keyboard 40 or entered from an external system.

FIG. 14 shows the timing and I/O port (IOP) multiplexing for control of the five d.c. motors 200 (M1–M5). An "X" indicates when the respective DM+ and DM− drive lines to the respective motors are active. Each motor sample cycle ts takes 2.5 ms, with 500 ms (tcw) being allocated to each motor. Tasks including motor control are entered and exited in accordance with the system multi-tasking diagram depicted in FIG. 6. Multi-tasking of postage meter functions in general is described in more detail in U.S. Pat. No. 4,710,883 referenced above; operation of postage meter 20 during the motor control cycle is described below.

Printing/accounting control I/O 36 and digit value selection mechanism 50 are invoked: if (a) a set-postage command is received from keyboard 40, or, from external system 46 via echoplex I/O 34; (b) if the steady-state position of any of d.c. motors 200 is disturbed, i.e., a position error is detected; and (c) during power-up (reset) position control initialization.

Whenever the digit value selection mechanism 50 is used, interposer 134 is dropped to inhibit any print-cycle and is raised to allow printing if microcomputer 22 is able to position the digits correctly and accounting in NVRAM 68 has enough funds for the value setting. Else, print interposer 134 remains down.

The control input to each control loop for a d.c. motor 200 is the desired position, and the output of the respective control loop is the actual digit value setting. D.c. motors 200 are in steady-state when there is no change in their final positions over time. Hence, a steady-state position error occurs when the final position changes any time after the last digitmove motion has been concluded. This error is detected during the normal check digit positions poll (tcl), and the actual motor positions are updated periodically in the set desired digit response (tc2) through the following sequence for each motor. The digit counter outputs are sampled; then the side transition count from the quadrature sequence is decoded. Then the transition count is added to the absolute position count. If any position error is detected, printing/accounting I/O and digit value selection mechanism 50 are invoked to correct the disturbed motor, or motors if more than one has been disturbed.

Figure 16:
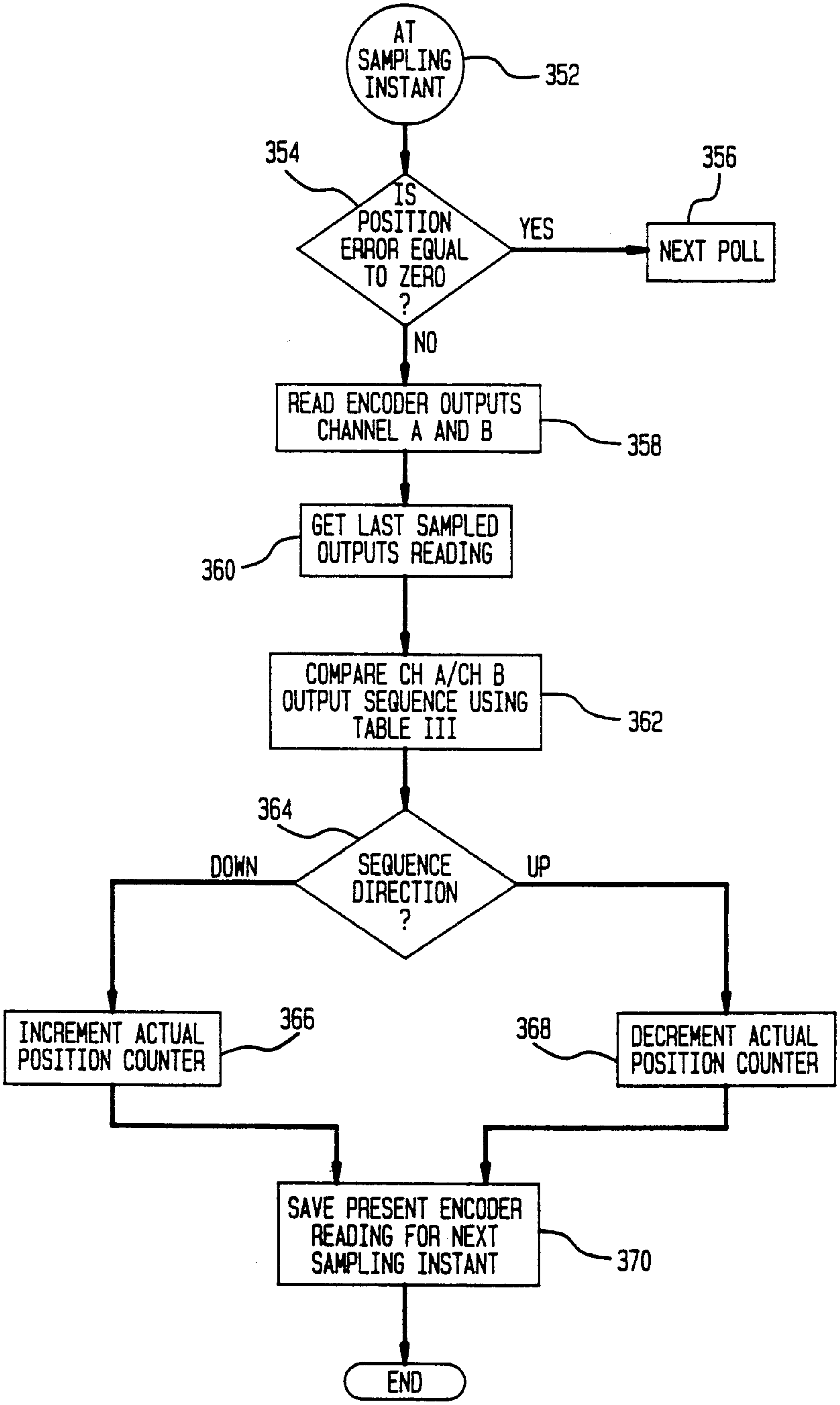
FIG. 16 is a flow chart illustrating decoding of the signals obtained from the encoder of FIG. 9.

The quadrature output signals of each encoder 205 on the CH A and CH B lines ar decoded in accordance with the flow chart of FIG. 16. At each sampling instant 352, the position error is checked in step 354. If it is zero, the microcomputer 22 is set in step 356 to proceed to the next sampling period for the next poll. If it is not zero, the CH A and CH B encoder outputs are read in step 358. In step 360, the encoder readings saved from the last sampling instant are retrieved, and in step 362, the CH A and CH B output sequence of encoder 205 is compared (Table III) to obtain the sequence direction. If down (determined in step 364, the actual position counter is incremented in step 366. If up (determined in step 364), the actual position counter is decremented in step 368. The encoder readings (i.e., the counter readings) are then saved in step 370 for the next sampling instant. The routine is repeated for each encoder in the respective sampling instant of the poll for a respective encoder. The counter readings are processed by microcomputer 22 to determine the actual positions of the print wheels, as described, for example, in the patents referred to above.

The longest time that digit position counters are not sampled (actual positions are not updated) during steady-state motor control occurs during the accounting cycle which lasts for 220 ms. Microcomputer 22 is still in control with one extended sampling interval, T=220 ms, because a steady-state disturbance, such as, "stick-tion", vibration, in printer unit 24, in general, has a frequency lower than the extended sampling frequency. This enables microcomputer 22 to provide a true closedloop position control for the digit value selection mechanism 50 of printer unit 24.

When a set-postage command is active, i.e., a desired position is input to control loop 300, microcomputer 22 provides motor drive signals to digit value selection mechanism 50 to position the five print wheels to the desired digits effectively simultaneously. As described below, the drive signals are supplied to the d.c. motors sequentially, but the net overall effect is that the print wheels are set effectively simultaneously, i.e., in parallel. After the print wheels have been positioned, the final digit positions are validated to ensure that the motion control positioning accuracy is in line with the full digit mechanize home positions, described below. If a positioning error occurs, a retry algorithm is executed for the print wheel(s) that failed. Digit setting is concluded to be successful when all the print wheels have completed the motor moves and their final positions are full digit home positions.

The motor commands for the five d.c. motors 200 are derived from the difference between each print wheel's desired and present digit value setting, where the sign (SGN) determines the direction of motion, and the magnitude determines the total distance St to be traveled (displacement) in terms of the number of encoder state transitions. If there is no change in a print wheel digit value, then the magnitude is zero (St equals zero).

Figure 15:
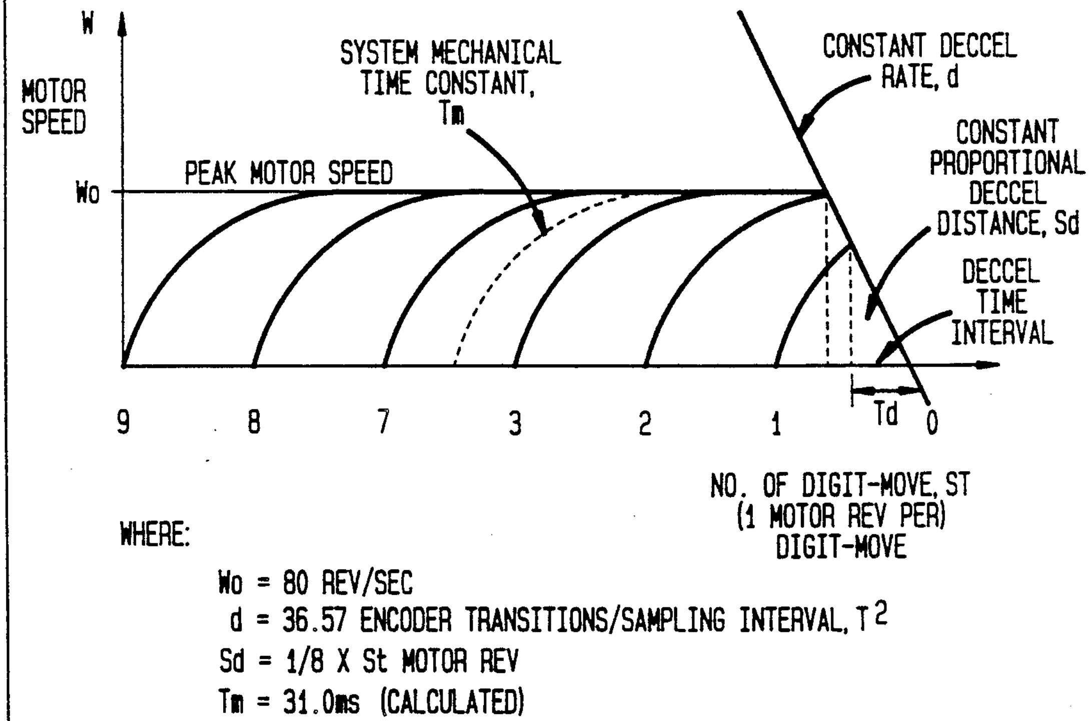
FIG. 15 is a diagram of the projected velocity profile for one of the d.c. motors controlled by the microcomputer of FIG. 2.

From the desired total displacement St and a constant deceleration (d), the deceleration distance Sd and the deceleration time interval Td are determined for every motor to be controlled, where Sd=0.125 *ABS(St), in number of encoder transactions; Td=SQRT (2* Sd/d), in units of sampling interval, T; d=deceleration rate=36.57142857 in number of encoder transactions per $T^2$. Further details controlling selection of those values may be found in the patents cited above and used by those of skill in the art to elect appropriate values for particular motors used. The results for Sd, Td, St and SGN(St) are the command inputs in CPU 29 executing the projected digit-move velocity profile, which is depicted in FIG. 15.

A retry routine is executed for the print wheels that failed. The retry routine includes a positioning control initialization procedure where the initial state of the position counters, relative to the known reference point on a print wheel, is reestablished for the print wheel with a digit value failure before trying again to move to the desired digit position. A maximum of five digit move retries is allowed. The motor is driven in the opposite direction of the last motion until it stalls against the endstop 240 (seek-move). Using the information that an endstop is no more than ½ motor revolution (½ digit), the number of encoder transition counts from the nearest full digit position to the endstop 240 is derived. This is an offset count which cannot be greater than three, as indicated above. To be able to use the endstop 240 as a reference point for the relative encoding scheme for each print wheel, the endstops 240, the full digit mechanical home positions and the encoder discrete states, must be aligned as shown in FIG. 11. Once a motor is at the endstop position, the distance from the endstop 240 to the opposite direction's farthest full-digit home position is calculated, i.e., total displacement, St=9 digit move counts plus the offset count (see FIG. 11). With this total distance input, the motor is driven to the farthest full-digit home position to validate the established reference point. That is, a successful move means that the starting position is, indeed, the print wheel's endstop 240, and the final position is a full digit home 0 or 9 (depending on the direction of motion). A failure of this move may start another iteration in the opposite endstop, i.e., another retry cycle. However, from this position, the digit-move to the original desired digit value is started. Any digit move failure will cause another retry if still within the limit count (e.g., 5) and, also, the allowable number of retries includes any digit move failures during the reference point initialization.

A relative incremental encoding scheme is used in control loop 300 where the endstop position for each print wheel is used as the reference point. Upon power up, or system reset, all the print wheel positions are verified relative to these endstop positions. The print wheel digits are set to all zeros, then, set to all nines, and then, back to all zeros. This is called a "soft" initialization procedure. An initialization routine is flow charted in FIG. 16.

Figure 17:
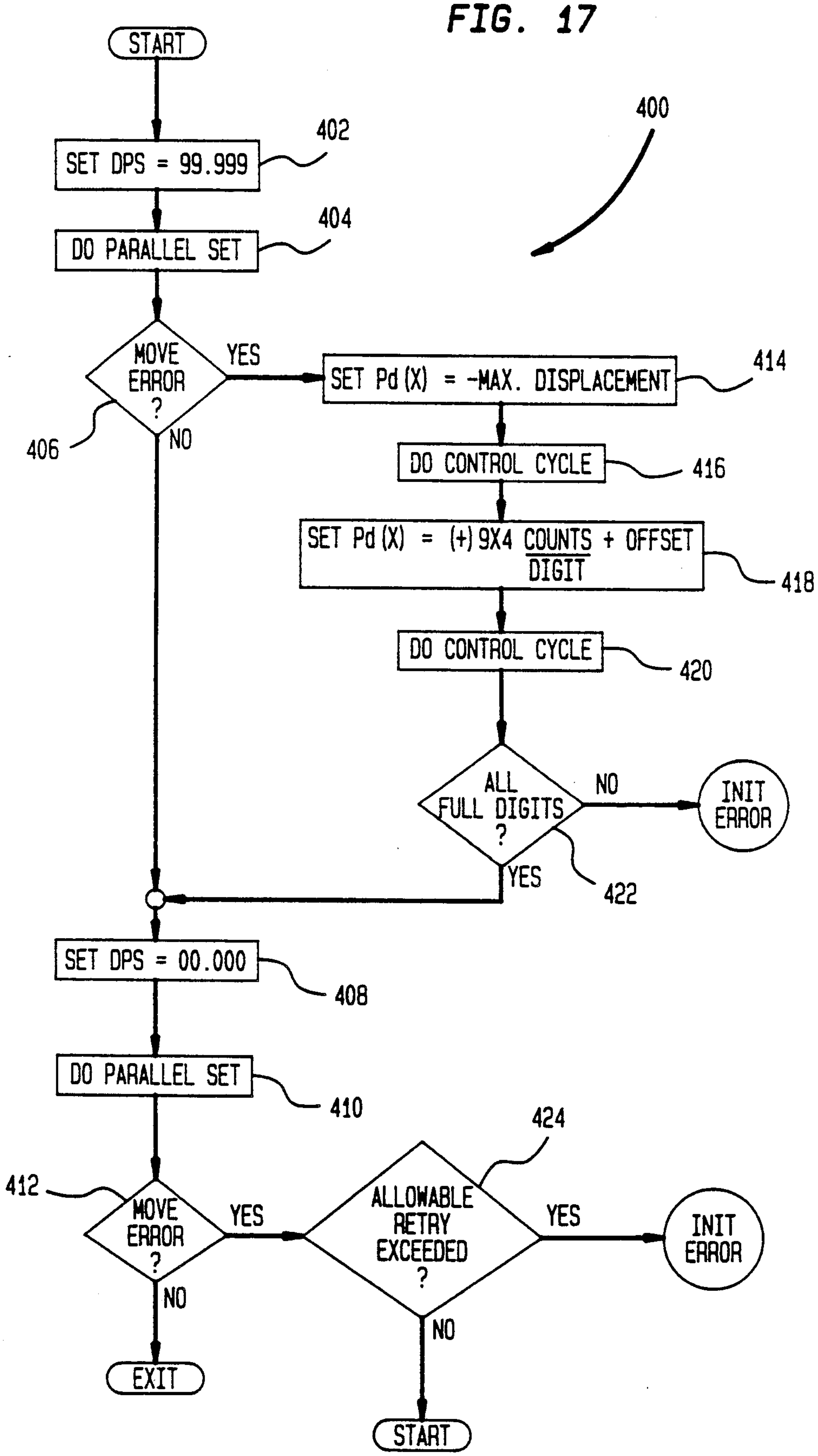
FIG. 17 is a flow chart of the initialization routine for controlling the print wheel setting d.c. motors.
Figure 18:
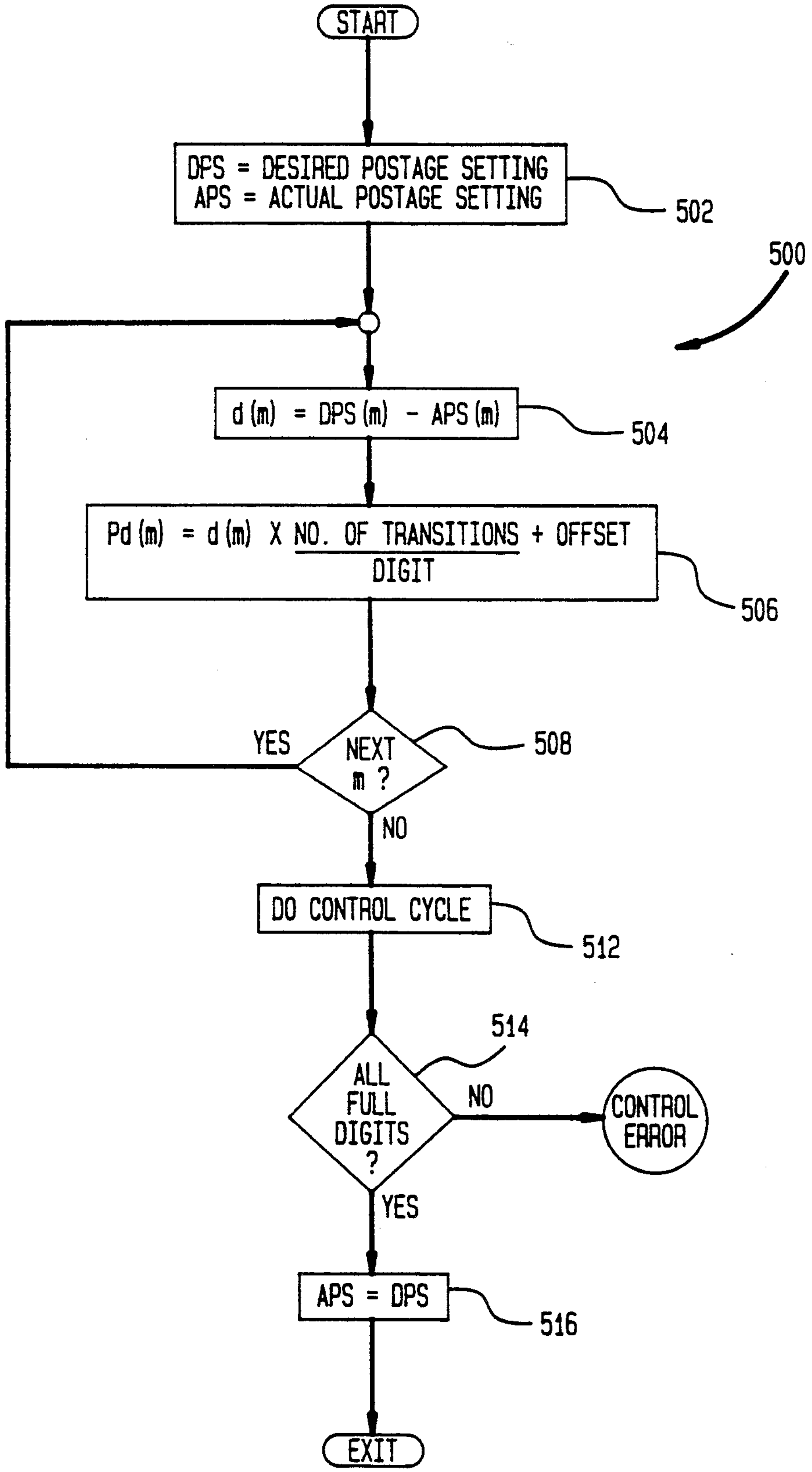
FIG. 18 is a flow chart of the setting routine for setting the positions of the print wheel setting d.c. motors in parallel.

Referring to FIG. 17, in step 402 of initialization routine 400 the desired position setting ("DPS") is set to all 9s. Next in step 404 (Do parallel set), respective print wheels are moved to their respective 9 setting. (The parallel set routine is flow charted in FIG. 18.) If no error is detected in step 406, i.e., the sensors detect a 9 home position for each of the motors, the desired position setting is set to all 0s in step 408 and the print wheels are moved in step 410. If no move error (no home position errors) are detected in step 412, then soft initialization is successful and the routine is exited.

Figure 19:
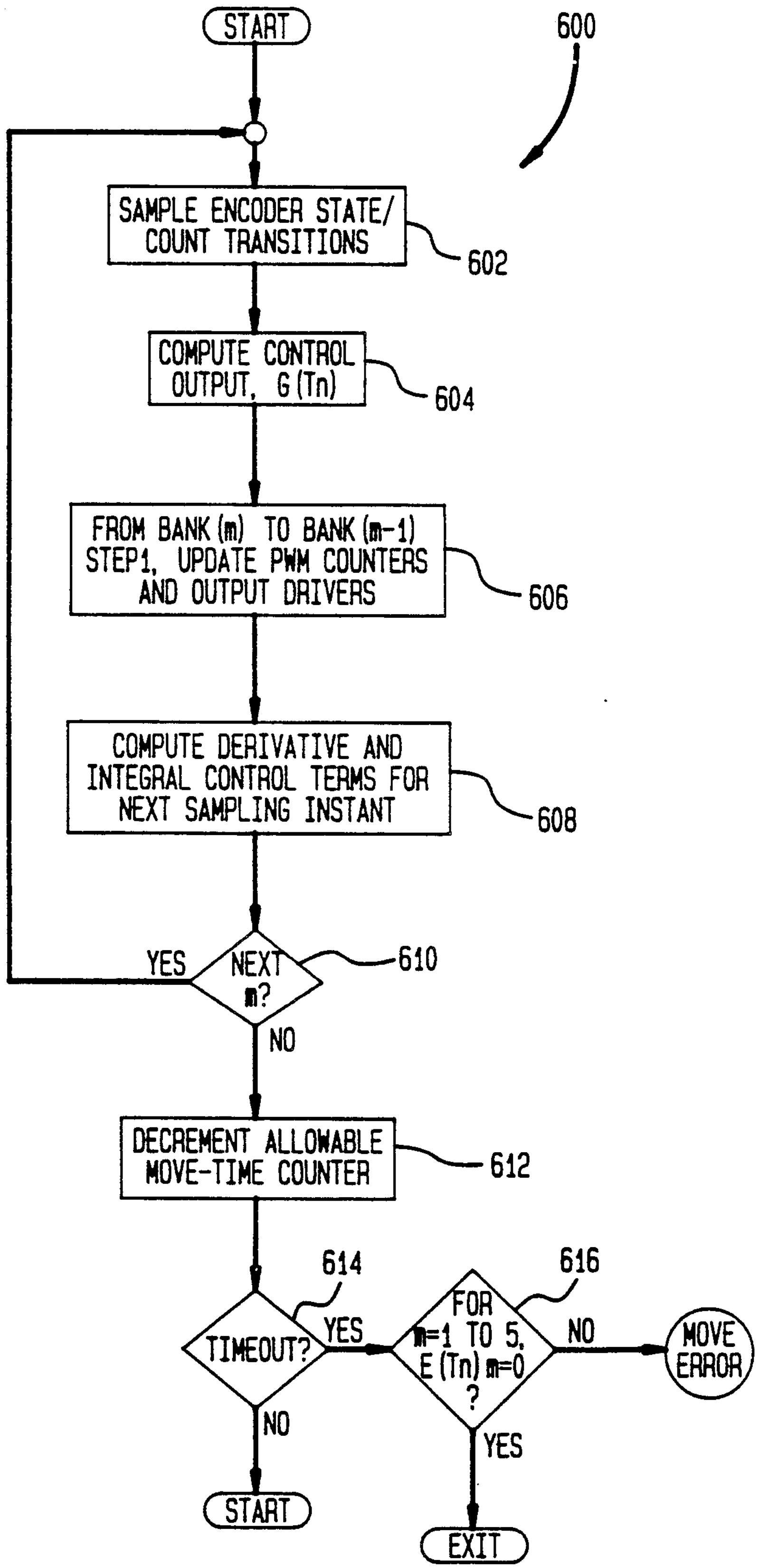
FIG. 19 is a flow chart of the control cycle routine for controlling the print wheel setting d.c. motors in parallel.

However, if any of the print wheels fails to execute the soft-initialization sequence correctly, i.e., a position error is detected in step 406, then, the digit move retry routine in steps 414–422 is invoked. This is called a "hard" initialization. In step 414, the displacement Pd is set to its maximum negative displacement. The control cycle routine in step 416 is flow charted in FIG. 19. In step 418, the displacement is calculated in terms of encoder transitions and offset. In step 420, a control cycle routine, as described in FIG. 19, is performed. If all full digits are detected in step 422, the algorithm proceeds to step 408. If not, an initialization error is generated. If an error is detected in step 412, and if the number of allowable retries in the retry routine has been not been exceeded (step 424), the initialization routine is repeated. If so, an initialization error is generated.

Thus, a successful "soft" initialization indicates that the initial digit value setting that all the print wheels assumed is correct. Motion control failures, or unknown digit value settings trigger a "hard" initialization.

In the parallel setting routine 500 flow charted in FIG. 19, the desired and actual postage setting for meter 20 are referenced in step 502. In step 504, the total displacement d for motor m is calculated. In step 506, the displacement Pd for motor m is calculated in terms of encoder transitions and offset. Step 508 causes steps 504 and 506 to be repeated until Pd has been calculated for all motors. When Pd has been calculated for all motors, the control cycle algorithm (FIG. 19) is executed in step 512. Step 514 determines whether all print wheels are full digits. If so, then the move is successful (step 516). If not, a control error is generated.

Referring to FIG. 13, generally in a servo loop, the digital control develops an output in the direction to correct the loop error, i.e., reduce the error to zero. Hence, if no error exists, the output is zero. In particular, if an error, +, exists between the desired position (Pd) and the actual position of the motor, as detected through the encoder transition count (Pa) in a sampling instant (T), the digital control 304 (Dz) computes the loop compensation for the error and the output is used by the pulse-width modulator 305 (Kpwm) to drive the d.c. motor to move the load in the direction of the desired position, i.e., the actual Pa will always follow the Pd position to reduce the position error e to zero. Hence, the error may come from the motion profile and timing control 302 which discretizes the desired digit-moved into Pd (every T interval) if invoked by the digit setting control, or, from the change in the actual position Pa if invoked by the steady-state position control.

Since the control portion of loop 300 is digital and essentially software-driven, a control is executed every sampling instant, nT. And since there are five d.c. motors 200 in postage meter 20, each control execution time (per motor) is T/5. (The timing for such control multiplexing scheme is shown in FIG. 14.) The sampling period, T, therefore, is limited by the maximum software execution time of the motion controller routines described below.

The motor position command is presented to the servo loop 300 through the motion profile and timing control 302 (W). This element contains the logic for generating the desired position command, Pd, depending on the motion phase, and supervises the parallel motions, i.e., motion start, phases, termination, and fault conditions. The servo loop 300 does not include a velocity control loop; motion supervision results in the projected motion velocity profile depicted in FIG. 15, which is based on a calculated mechanical time constant.

At the first phase of the motion, the total desired displacement is presented to the servo loop as Pd, thereby, creating a large initial error which saturates the control at 100% PWM duty cycle, driving the motor to its maximum loaded acceleration, i.e., step function response. The time it takes for the motion to reach its peak slew speed depends on the mechanical system time constant. The motion enters the second phase when the sampled actual position Pa indicates that the remaining distance to be travelled is equal or less than the computed deceleration distance, Td. Once this occurs Pd becomes the remaining distance discretized every sampling period T at the desired deceleration rate. $Pd(T)=\frac{1}{2}\times d\times[(Td-sT)]^2$, where Pd(T)=discretized deceleration distance in encoder transition counts; d=desired deceleration rate in encoder transition counts per $T^2$; Td=computer deceleration time in units of T; and sT=elapsed time in units of T. At the end of the computed deceleration time Td (in units of T), the discretized Pd(T) is equal to the total desired displacement. The Sd and Td are inputs to digital compensation control 304 computed by the motion profile and timing control 302, together with the desired total displacement (in encoder transition counts). Hence, the third phase is where Pd remains constant for the settling time period of the motion. The motion is concluded to be complete if no position error is detected within a settling time period, Ts; else, the motion is allowed again to settle within another settling time period for a maximum of ten periods (as in the case of an underdamped system).

Microcomputer 22 coordinates the five digital compensation controls 304 effectively simultaneously for the five d.c. motors. Since the five controls 304 may have different total displacement commands, i.e., value settings, and may have different response times, the motion completion time among the five d.c. motors varies. Completion of the longest distance-move, or, the slowest move, due to too overdamped (bind) or underdamped (oscillatory) conditions, is awaited before completion of the parallel motion control is concluded. The d.c. motor with the least distance to move, or, with the fastest response time, gets the benefit of extra settling time periods while waiting completion of movements of the last motor to be moved. A maximum timeout of 750 ms (from the start of the motion) is provided for all controls 304 to have zero position errors. The status of the position error for each of the five motors, i.e., zero or not zero, is returned by the motion controller.

Encoder quadrature decoder and counter 306 (Kp) in servo 300 loop transforms the motor shaft position into a 2-bit Gray Code digital count through the two-channel output of the digit encoder sensors, shown in FIGS. 5, 8 and 9. (See the flow chart in FIG. 16 and related description thereof above.) At every sampling instant, Tn, the digit sensor output is read (using best-of-three voting), then, the quadrature state is decoded, and depending on the state sequence direction, as shown in Table III below, the actual position counter, Pa, is incremented or decremented from its initial value. Hence, the count value is an incremental number of encoder state transitions relative to the initial value of the counter. In case of the quadrature decoding error of counting two transitions in a sampling interval (due to electrical noise, or, encoder/motor deviations accepted tolerance), an incremental count of 0 is taken which forces a positioning error to be detected at the end of the motion.

TABLE III

Encoder Sensor Quadrature Output Sequence

| | | CH A | CH B | |
|---|---|---|---|---|
| Digit increasing ↓ | ↑ | 0 | 0 | HOME |
| | | 0 | 1 | |
| | | 1 | 1 | |
| | | 1 | 0 | |
| | Digit decreasing | 0 | 0 | HOME |

The digital compensation control 304 is a control routine derived from a lead/lag compensation filter design for the closed-loop system 300 shown in FIG. 13. Its output, g(Tn), at every sampling instant T, is a discretized filter output to correct the loop error and provides the desired damping characteristics. The control routine is basically a PID controller (proportional-integral-derivative), but differs in implementation of the derivative control because of the coarse encoder resolution of the system.

The encoder resolution limitation is imposed by the sampling bandwidth because sampling, quadrature decoding, and counting are multiplexed, hence, limiting the cycle period by the execution time to multiplex all five controls 304 (T time interval). This results in the servo loop 300 not including a velocity loop, due to the coarse position resolution feedback. This produces the following effect in the loop characteristic: the rate of change of the position error per sampling interval, de/T, is normally zero; low open-loop dc gain to maintain stability; low servo control bandwidth with 25 to 50 ms settling time and about 50% overshoot; and zero steady-state position error.

The control routine 600 for digital compensation control 304 of loop 300 (FIG. 13) is flow charted in FIG. 19. The encoder state/count transitions are sampled for a first motor m1 in step 602. Then, the control output G (TN) for motor m1 is computed according to the following in step 604.

$E(Tn)=Pd(Tn)-Pa(Tn)$

```
If E(Tn)  =  0
             THEN X(Tn - 1) = 0
             ELSE
G(Tn)     =  K1 * E(Tn) + X(Tn - 1)
```

Then, the pwm counters and output drivers are updated for motor M1 in step 606. Next in step 608, the derivative d E(T) and the integration X(Tn) are computed as follows:

```
dE(T)     =  E(Tn) - E(Tn - 1)
IF dE(T)  =  NOT 0
             THEN X(Tn) = 0
             ELSE X(Tn) = X(Tn - 1) +
             SGN[E(Tn)] * K2, where
```

E=position error count; Pd=desired position count; Pa=actual position count; X=summer; refers to the value of the variable at the present sampling instant, and (Tn−1) is at the last sampling instant; K1=proportional control constant (dc gain)=3; and K2=integral control constant=0.01953

From the above routines for computing G (Tn), d E(T) and X (TN), the proportional control is contributed by the K1×error (T) result, i.e., an output control proportional to the error is always developed in the direction to correct the error. The integration X (Tn) function in step 608 is implemented by the summer X, where it keeps on incrementing by K2 every T instant as long as the error is constant and not zero. This ensures correct steady-state positional error and causes control 304 to saturate (driving full power to the respective motor) if an error persists, i.e., bind condition. The derivative dE(T) in control 304, in general, develops an output to oppose large changes in the loop error. The routine approximates this control by resetting the integral control summer, X(Tn) when an encoder state transition occurs, i.e., dE(T)=not 0, and canceling the integral control output, X(Tn−1), whenever the position error, E(Tn), becomes zero, causing a zero output dead-band at the home position crossings.

To handle five separate position loops, the control 304 is multiplexed within a 2.5 ms period as shown in FIG. 14. Hence, digital compensation control for each motor takes 500 us which includes the decoding and counting of the shaft encoder signal, execution of the above routines for G(Tn), dE(T), and X(Tn), the generation of the output drive signal, and the calculation of the next period's desired position (in encoder counts). Thus, referring to FIG. 19, the above routines are repeated for each motor until it is determined in step 610 that the algorithms have been executed for all motors.

Then in step 612, the allowable move-time counter is decremented which maintains the polling execution time for the time has elapsed by time-out of a timer. If it has not, the algorithm recycles and continues. If it has the routine proceeds to step 616 where microcomputer 22 determines if there is a position error. If there is not (i.e., E(Tn)m=0), microcomputer 22 exists from the digital compensation control algorithm. If there is (i.e., E(Tn)m=0), a move error is generated.

The output of digital compensation control 304 is transformed into a pulse width modulated (PWM) signal in pulse width modulator 305 by the routine shown below which generates or updates the PWM signal for the five digital compensation controls every 500 us. Hence, this routine provides five discrete torque (current) values to each motor, i.e., a 500 us increment with a 2.5 ms period. The next period's desired position is determined through a look up table of discretized decelertion distance values with respect to the 2.5 ms interval (sampling period), that is, a control deceleration is invoked when 3/4 of the total desired displacement is reached with 100% PWM duty cycle (saturated drive). Pulse width modulator 305 converts the digital control output, G(Tn), into a voltage equivalent, Veq, where $$Veq = \frac{G(Tn) * T/5 * 5 \text{ volts}}{T} = G\ (Tn) \text{ volts}$$

The pulse width modulated outputs to the five d.c. motors are updated during execution of control for each of the motors in a period T for the five motor, or T/5 for each motor. The following routine illustrates update of the pulse width modulated drives to the five motors starting with the motor (m) being controlled at the T/5 time instant, where m=1, 2, 3, 4, 5 for the five motors.

```
LET G(Tn) = G(Tn)m + 1
FOR i = m TO (m - 1) STEP 1 MODULO 5
IF G(Tn)i = 0
      THEN PWM OFF
      ELSE
G(Tn)i = G(Tn)i - SGN[g(Tn)i] * 1
PWM OFF: IF G(Tn)i = 0
DIRECTION OUTPUT = dont' care
ENABLE OUTPUT = 0
PWM POS: IF SGN[G(Tn)i] = (+)
DIRECTION OUTPUT = 0
ENABLE OUTPUT = 1
NEXT i
```

Signals generated as described by the above algorithm drive the output stage drive amplifiers 134 which switch the motor voltage supply Vs (FIG. 13) to the d.c. motor terminals according to the PWM duty cycle.

A microcomputer implemented control loop for controlling a d.c. motor is described in the patents referenced above. Those patents further disclose algorithms by which the digital compensation control 304 (or a lead/lag filter) is implemented, and the PWM duty cycle is implemented. As stated above, the disclosures of each of the patents cited above are incorporated herein by reference. Thus, those with skill in the art by means of the disclosure herein and in those patents may construct program implementing the digital compensation control or lead-lag filter 304, the pulse width modulator 305 and the encoder quadrature decoder and counter 306.

The particular number of d.c. motors controlled by microcomputer 22 may be set. In the presently preferred embodiment, up to five d.c. motors may be controlled. If less than five are used, a mask is set in printing/accounting I/O for any missing motors. The mask maintains any channel not having a motor channel disabled, i.e., it ignores a position error created in the control loop for the missing motor.

Certain changes and modifications of the embodiments of the invention herein disclosed will be readily apparent to those of skill in the art. Moreover, uses of the invention other than in postage meters or to control d.c. motors other than to set print wheels will also be readily apparent to those of skill in the art. It is intended to cover by the claims all such uses and all those changes and modifications which cbe made to the embodiments of the invention herein chosen for the purposes of disclosure which do not depart from the spirit and scope of the invention.

What is claimed is:

1. An incremental position encoder comprising a movable element having first series and second series of variations, the variations of the first and second series extending along respective parallel lines in a direction of movement of said movable element and the variations of the first and second series being transversely spaced with respect to each other, the widths of the first and second variations being equal and offset by a substantial amount, but less than a full width of a variation, the variations of the first and second series being detectable, said encoder including encoder signal means for detecting at a reference point said variations and providing first and second signals related to detection of said variations of said first and second series, respectively.

2. The encoder of claim 1 wherein said variations are optically detectable and said encoder signal mean comprises means for projecting light at variations in said first and second series of variations and for detecting light emanating from the variations of said first and second series of variations.

3. The encoder of claim 1 wherein said movable element is a wheel and said first and second series of variations are radially spaced and extend circumferentially about respective circumferences of first and second circles, a circumferential widths of the variations of said first and second variations being equal and circumferentially offset by half the circumferential width of a variation.

4. The encoder of claim 3 wherein said encoder signal means provides said first and second signals out of phase by 90°.

5. The encoder of claim 2 wherein said movable element is a wheel and the variations of said first and second series of variations comprise circumferentially-extending slotted openings in said wheel, said slotted openings being of equal circumferential width, radially spaced from each other, equidistantly angularly arranged about a respective circumferences of first and second concentric circles, and offset by half the circumferential width of an opening from each other, and wherein said encoder signal means provides said first and second signals out of phase by 90°.

6. The encoder of claim 5 wherein said light projecting means comprises means for projecting light through said slotted openings in said first and second series of openings and for detecting light projected through said openings of said first and second series of openings.

* * * * *